United States Patent
Sato et al.

(10) Patent No.: US 11,467,087 B2
(45) Date of Patent: Oct. 11, 2022

(54) OPTICAL SENSOR, LIGHT DETECTION APPARATUS, SHEET PROCESSING APPARATUS, LIGHT DETECTION METHOD, AND PHOSPHORESCENCE DETECTION APPARATUS

(71) Applicant: GLORY LTD., Hyogo (JP)

(72) Inventors: Takeshi Sato, Hyogo (JP); Hiroshi Konishi, Hyogo (JP)

(73) Assignee: GLORY LTD., Hyogo (JP)

( * ) Notice: Subject to any disclaimer, the term of this patent is extended or adjusted under 35 U.S.C. 154(b) by 76 days.

(21) Appl. No.: 16/498,440

(22) PCT Filed: Mar. 26, 2018

(86) PCT No.: PCT/JP2018/012046
§ 371 (c)(1),
(2) Date: Sep. 27, 2019

(87) PCT Pub. No.: WO2018/181134
PCT Pub. Date: Oct. 4, 2018

(65) Prior Publication Data
US 2021/0116370 A1    Apr. 22, 2021

(30) Foreign Application Priority Data

Mar. 27, 2017  (JP) .............................. JP2017-061065
Mar. 27, 2017  (JP) .............................. JP2017-061074
Mar. 27, 2017  (JP) .............................. JP2017-061081

(51) Int. Cl.
*G01N 21/64* (2006.01)
*G01J 1/02* (2006.01)
(Continued)

(52) U.S. Cl.
CPC ............ *G01N 21/6408* (2013.01); *G01J 1/02* (2013.01); *G01J 1/42* (2013.01); *G01N 21/645* (2013.01);
(Continued)

(58) Field of Classification Search
CPC ............ G01N 21/6408; G01N 21/645; G01N 2021/8663; G07D 7/121; G01J 1/42; G01J 1/02; H01L 31/12
See application file for complete search history.

(56) References Cited

U.S. PATENT DOCUMENTS 4,977,325 A * 12/1990 Bowen ................ G01N 21/645
250/372
5,280,333 A *  1/1994 Wunderer ............ G07D 7/121
235/491
(Continued)

FOREIGN PATENT DOCUMENTS

CN   102176260 A   9/2011
CN   103649728 A   3/2014
(Continued)

OTHER PUBLICATIONS

International Search Report from International Application No. PCT/JP2018/012046 dated Jun. 19, 2018.

*Primary Examiner* — Marcus H Taningco
(74) *Attorney, Agent, or Firm* — Brundidge & Stanger, P.C.

(57) ABSTRACT

An aim is to reduce the size of an optical sensor which detects radiated light such as phosphorescence radiated from a detection target excited by exciting light, and to increase a radiated light receiving surface of the optical sensor. An optical sensor is configured to be provided with: a light source which irradiates excitation light; a light detector which detects radiation light emitted from a detection target excited by the excitation light; and a single light guide unit
(Continued)

which guides the excitation light to the detection target and guides the radiation light to the light detector.

10 Claims, 18 Drawing Sheets

(51) Int. Cl.
    *G01J 1/42*     (2006.01)
    *G07D 7/121*     (2016.01)
    *H01L 31/12*     (2006.01)
    *G01N 21/86*     (2006.01)

(52) U.S. Cl.
    CPC .............. *G07D 7/121* (2013.01); *H01L 31/12* (2013.01); *G01N 2021/8663* (2013.01)

(56) References Cited

U.S. PATENT DOCUMENTS

| | | | |
|---|---|---|---|
| 5,512,758 A | 4/1996 | Kobayashi et al. | |
| 5,918,960 A * | 7/1999 | Hopwood | G07D 7/121 356/71 |
| 6,297,509 B1 | 10/2001 | Lipkowitsch et al. | |
| 6,365,908 B1 * | 4/2002 | Waigel | G08B 19/02 250/574 |
| 6,777,704 B2 | 8/2004 | Giering | |
| 6,918,482 B2 | 7/2005 | Thierauf | |
| 7,262,420 B1 | 8/2007 | Macleod | |
| 7,271,398 B2 * | 9/2007 | Androsyuk | G07D 7/121 250/461.1 |
| 8,759,794 B2 | 6/2014 | Rapoport et al. | |
| 10,650,630 B2 * | 5/2020 | Rapoport | G07D 7/121 |
| 2002/0020808 A1 | 2/2002 | Kado | |
| 2002/0026108 A1 | 2/2002 | Colvin | |
| 2002/0079454 A1 * | 6/2002 | Yamada | G07D 7/121 250/358.1 |
| 2002/0154289 A1 | 10/2002 | Wilks | |
| 2002/0195571 A1 * | 12/2002 | Kamijo | G06K 7/12 250/458.1 |
| 2003/0156290 A1 | 8/2003 | Colvin | |
| 2004/0031931 A1 | 2/2004 | Mueller | |
| 2004/0201835 A1 | 10/2004 | Coates | |
| 2005/0127305 A1 | 6/2005 | Androsyuk et al. | |
| 2006/0072822 A1 | 4/2006 | Hatzav et al. | |
| 2006/0158653 A1 | 7/2006 | Chiarello | |
| 2006/0241351 A1 | 10/2006 | Feng | |
| 2008/0259314 A1 * | 10/2008 | Kamijo | G07D 7/12 356/51 |
| 2009/0173891 A1 | 7/2009 | Oda | |
| 2010/0148083 A1 * | 6/2010 | Brown | G01J 3/26 250/372 |
| 2011/0147450 A1 * | 6/2011 | Rapoport | G07D 7/1205 235/375 |
| 2013/0015651 A1 | 1/2013 | Lau | |
| 2014/0097359 A1 | 4/2014 | Vasic et al. | |
| 2015/0348351 A1 | 12/2015 | Deckenbach et al. | |
| 2016/0005252 A1 | 1/2016 | Kayani | |
| 2016/0125682 A1 | 5/2016 | Rapoport et al. | |
| 2016/0225215 A1 | 8/2016 | Yamaguchi et al. | |
| 2017/0153184 A1 | 6/2017 | Bogaki | |
| 2020/0244834 A1 * | 7/2020 | Bogaki | G01J 1/0488 |

FOREIGN PATENT DOCUMENTS

| | | | |
|---|---|---|---|
| CN | 106463010 A | 2/2017 | |
| EP | 3133562 A1 | 2/2017 | |
| JP | 06-309546 A | 11/1994 | |
| JP | 2001-291458 A | 10/2001 | |
| JP | 2002-197506 A | 7/2002 | |
| JP | 2004501435 A | 1/2004 | |
| JP | 2005513426 A | 5/2005 | |
| JP | 3790931 B2 | 4/2006 | |
| JP | 2007-514219 A | 5/2007 | |
| JP | 2014-519130 A | 8/2014 | |
| JP | 2015-525880 A | 9/2015 | |
| WO | WO-03030621 A2 * | 4/2003 | ............ G01N 21/31 |
| WO | 2015045186 A1 | 4/2015 | |
| WO | 2015159438 A1 | 10/2015 | |
| WO | 2016069858 A1 | 5/2016 | |

\* cited by examiner

OPTICAL SENSOR, LIGHT DETECTION APPARATUS, SHEET PROCESSING APPARATUS, LIGHT DETECTION METHOD, AND PHOSPHORESCENCE DETECTION APPARATUS

TECHNICAL FIELD

The present invention relates to an optical sensor for detecting radiation light such as phosphorescence emitted from a detection target excited by excitation light, a light detection apparatus including the optical sensor, a sheet processing apparatus including the light detection apparatus, and a light detection method and a phosphorescence detection apparatus for detecting the radiation light.

BACKGROUND ART

Conventionally, security marks having predetermined optical characteristics have been used to recognize authenticity of sheets, such as banknotes and documents, products, and the like. For example, a security mark including a special material that does not emit radiation light, such as phosphorescence, under visible light but emits radiation light only when irradiated with excitation light of a predetermined wavelength such as ultraviolet light is provided on a sheet or product package by printing or the like so that the authenticity of sheets, products, and the like are determined from the radiation light state of radiation light. Fluorescence emitted at the time of excitation light irradiation and phosphorescence emitted after the excitation light irradiation are used as radiation light.

PTL 1 discloses an apparatus that irradiates excitation light from a light source to an item marked with a luminescent material and moving on a manufacturing line, and detects the luminescent light with five photosensors.

PTL 2 discloses an apparatus that irradiates the fluorescent substance in a banknote with ultraviolet light from a light-emitting diode disposed obliquely to the banknote, and detects the fluorescence emitted from the banknote by using a fluorescence detector through an optical system using a lens.

PTL 3 discloses an apparatus that that irradiates a banknote with excitation light from a light source disposed obliquely to the banknote, and detects luminescent light excited in or on the banknote by using a detector unit through an optical system using a lens.

PTL 4 discloses an apparatus that irradiates a banknote with excitation light and detects emitted fluorescence and phosphorescence to verify the authenticity of the banknote. In the apparatus disclosed in PTL 4, fluorescence or phosphorescence is detected using an array detector through an optical system provided with a cylindrical lens.

PTL 1 further discloses an apparatus for discrimination between two luminescent materials that emit light within the same wavelength range and contain two dyes having different decay time constants at different ratio. This apparatus, which has a large number of photodetectors along a path, detects a luminescence intensity profile and compares the intensity value of a normalized intensity profile or the time required for decay with a reference value or compares the curve shape of the normalized intensity profile with the curve shape of a reference luminescence intensity profile. This allows the luminescent materials to be identified even when the normalized luminescence intensity profiles of the two luminescent materials are very similar, despite the different ratio of the two dyes.

PTL 5 discloses an apparatus that irradiates a banknote with excitation light and detects emitted fluorescence to verify the authenticity of the banknote. This apparatus detects phosphorescence using two sensors and verifies the ratio between the phosphorescent intensities detected by the sensors.

PTL 6 discloses an apparatus that irradiates a banknote with excitation light and detects emitted fluorescence to verify the authenticity of the banknote. This apparatus detects a peak of a phosphorescent spectrum obtained by irradiation with excitation light, and detects decay characteristics for the wavelength of each detected peak.

PTL 1 further discloses an apparatus for distinction between two luminescent materials that emit light within the same wavelength range and contain two dyes having different decay times in different ratio. This apparatus detects the decay time characteristics of the luminescent material on the item conveyed at high speed to create a measured luminescence intensity profile and compares it with a reference intensity profile. The conveyance speed V is 6 m/s (6000 mm/s). The excitation time interval $\Delta$tex of the light source is 100 μs (0.1 ms). The time delay $\Delta$td after the turning off of the light source is 40 μs (0.04 ms). The measurement time interval $\Delta$tm of the excited luminescent material is 4000 μs (4 ms). In addition, the drawing shows that there are five optical sensors. Therefore, when detection is performed five times during the measurement time interval $\Delta$tm at equal intervals, each detection is performed every 1000 μs (1 ms). The apparatus disclosed in PTL 1 creates a measured luminescence intensity profile through this five times of detection.

PTL 6 further discloses an apparatus for irradiating a banknote with excitation light, detecting emitted phosphorescence, and verifying the authenticity of the banknote. This apparatus detects a peak of the phosphorescent spectrum obtained by irradiation with excitation light, detects a decay characteristics for the wavelength of each detected peak, and compares it with the registered feature. This apparatus performs the first measurement for 500 μs (0.5 ms) immediately after the light source is turned off (that is, without delay). After the light source is turned on again, the light source is turned off again, and the next measurement is performed during the period of 500 is (0.5 ms) after 100 μs (0.1 ms) has elapsed after the second turning off (that is, with a time delay of 100 μs). This apparatus repeats the measurement until the lapse of the emission decay time while increasing the time delay.

PTL 5 further discloses a method of determining the authenticity of a document by determining the ratio between the intensity value detected in the first spectral region and the intensity value detected in the second spectral region. Detection of the emission intensity starts 50 μs (0.05 ms) after the end of excitation of a luminescent material and lasts 50 μs (0.05 ms). Detection of the emission intensity starts after a time interval of 100 μs (0.1 ms) and lasts 50 μs (0.05 ms). The decay time of the intensity value detected in the first spectral region is $\tau 1=200$ μs (0.2 ms), and the decay time of the intensity value detected in the second spectral region is $\tau 2=400$ μs (0.4 ms).

CITATION LIST

Patent Literature

PTL 1
Japanese Unexamined Patent Application Publication (Translation of PCT Application) No. 2014-519130

PTL 2

U.S. Pat. No. 6,918,482

PTL 3

U.S. Pat. No. 6,777,704

PTL 4

Japanese Patent No. 3790931

PTL 5

U.S. Patent Application Publication No. 2015/348351

PTL 6

U.S. Pat. No. 7,262,420

SUMMARY OF INVENTION

Technical Problem

The apparatus disclosed in PTL 1, which has multiple detectors, is advantageous in that it provides a large radiation light reception area, but is disadvantageous in that the apparatus is complicated and large.

The apparatus disclosed in PTL 2, PTL 3, or PTL 4 uses an optical system using a lens. It is therefore necessary to secure a distance corresponding to the lens focal length between the lens and the fluorescence detector, detector unit, or array detector. In other words, the apparatuses disclosed in these literatures have the problem that they can hardly be miniaturized. Besides, since the light reception area is restricted by the lens diameter in an optical system using a lens, the apparatuses disclosed in these literatures have the problem that they can hardly have a large light reception area.

As described above, the conventional apparatus cannot simultaneously achieve the miniaturization of the sensor unit for detecting radiation light and the enlargement of the radiation light reception surface. An object of the present invention, which has been made in view of such a situation, is to enlarge the radiation light reception surface of the sensor while miniaturizing the sensor.

Further, in the apparatus disclosed in PTL 1, for distinction between luminescent materials, regardless of whether it is a luminescent material of a single dye or a luminescent material of multiple dyes having different decay time constants, it is necessary to prepare in advance a reference value or a reference curve shape for each luminescent material. In other words, a luminescent material for which a reference is prepared can be identified, whereas a luminescent material for which a reference is not prepared, it is impossible to identify whether the luminescent material is a luminescent material of a single dye or a luminescent material of multiple dyes.

Further, the apparatus disclosed in PTL 5 verifies the authenticity of a banknote by using the ratio between the phosphorescent intensities detected by the two sensors as a feature, and is not capable of determining whether each luminescent material that has emitted phosphorescence is a luminescent material of a single dye or a luminescent material of multiple dyes having different decay time constants.

The apparatus disclosed in PTL 6 detects the decay characteristics for the wavelength of each detected peak, and may be capable of determining whether a luminescent material that has emitted phosphorescence is a luminescent material of a single dye or a luminescent material of multiple dyes having different phosphorescent colors, according to the number of peaks. However, whether the luminescent material that has emitted phosphorescence is a luminescent material of a single dye or a luminescent material that emits light within the same wavelength range and is composed of multiple dyes having different decay time constants cannot be determined.

As described above, the apparatuses disclosed in PTLs 1, 5, and 6 are not capable of judging whether a phosphorescent material that has emitted phosphorescence is a phosphorescent material of a single dye or a phosphorescent material of multiple dyes that emit light in the same wavelength range and have different decay time constants.

An object of the present invention, which has been made in view of such a current situation, is to determine whether or not detected phosphorescence results from multiple types of phosphorescence that are within the same wavelength range and have different decay time constants.

In addition, as in the apparatus disclosed in PTL 1 or 6, when the feature of a phosphorescent decay is determined by repeating detection more than once and is compared with a registered phosphorescent feature, phosphorescence can be accurately detected but it takes time to detect it. It is therefore difficult to speed up the processing.

The invention disclosed in PTL 5 detects phosphorescence only twice and only determines the ratio between two types of phosphorescence, and does not detect a phosphorescent feature, such as a decay time constant.

Phosphorescent materials are materials that are excited upon reception of excitation light, such as visible light and ultraviolet light, and emit phosphorescence. The intensity (light amount) of the phosphorescence emitted from a phosphorescent material reaches a maximum at the end of the irradiation with excitation light and then gradually attenuates. The color and decay time constant of the phosphorescence emitted from a phosphorescent material depends on each phosphorescent material. Even different phosphorescent materials may have the same phosphorescent color or/and decay time constant. In addition, the number of types of phosphorescence emitted from a single phosphorescent material is not always one and may be more than one. The following description is based on the assumption that one type of phosphorescence is emitted from a phosphorescent material for the sake of simplicity. Moreover, even phosphorescence having different apparent phosphorescent colors can be treated as phosphorescence within the same wavelength range as long as it is within the wavelength range detectable by a photodetector. The relationship between the intensity of phosphorescence emitted from a single phosphorescent material $\alpha$ and time is represented by Expression 1.

[Expression 1]

$$P_\alpha = A_\alpha \exp(-t/\tau_\alpha) \qquad (1)$$

In Expression 1, $P_\alpha$ is the intensity of phosphorescence emitted from a phosphorescent material $\alpha$, $A_\alpha$ is a constant determined by the concentration and the emission efficiency of the phosphorescent material $\alpha$, t is the time elapsed from the time of the turning-off of excitation light to the time of detection, and $\tau_\alpha$ is the decay time constant of the phosphorescence emitted from the phosphorescent material $\alpha$. Even when the phosphorescent material $\alpha$ is a mixture of a plurality of phosphorescent materials having the same decay time constant, the relationship between the intensity of phosphorescence emitted from the phosphorescent material $\alpha$ and time is similarly expressed by Expression 1.

When the detected phosphorescence is phosphorescence emitted from a single phosphorescent material having a decay time constant or a plurality of phosphorescent materials having the same decay time constant, the decay time constant of the phosphorescent material can be determined by detecting the intensity twice changing the detection timing (detection time), and solving the simultaneous expression of Expression 1.

The following description is based on the assumption that, regarding the time t in Expression 1, the detection timing of phosphorescence is time $t_n$. The time $t_n$ is represented by the time elapsed from turning-off of excitation light to detection, and the time when the excitation light is turned off is to =0.

To be specific, after the stop of irradiation of excitation light, the intensity $P_1$ and intensity $P_2$ of the phosphorescence emitted from the detection target are detected at the time t1 (first timing) and the second time t2 (second timing). With the intensity $P_1$ and intensity $P_2$ and the time $t_1$ and time t2 at which they are detected, the decay time constant Tec of the phosphorescence emitted from a detection target is calculated based on the following Expression 2.

[Expression 2]

$$\tau_\alpha = -(t_2-t_1)/\ln(P_2/P_1) \quad (2)$$

In this manner, the decay time constant of phosphorescence emitted from the detection target is calculated from a difference in detection timing $t_2-t_1$ and the intensity ratio $P_2/P_1$ so that the phosphorescence is recognized, whereby the authenticity of a sheet or the like having the detection target can be determined.

When the phosphorescence emitted from the detection target results from multiple types of phosphorescence having different decay time constants, the intensity of the phosphorescent cannot be expressed by Expression 1, but the decay time constant obtained when it is approximated by phosphorescence that has a single decay time constant can be determined by the aforementioned calculation method. This can also be recognized as a phosphorescent feature.

However, as the difference between the time $t_1$ and the time $t_2$ decreases, the amount of change in the intensity of phosphorescence decreases, which may make it susceptible to unevenness of the phosphorescent material c printed on the detection target, errors made by detectors, and the like, and make it difficult to accurately calculate the decay time constant T. It is therefore important to set an appropriate detection timing of phosphorescence according to the decay characteristics of a phosphorescent material to be detected.

An object of the present invention, which has been made in view of such circumstances, is to provide an apparatus capable of recognizing recognition target phosphorescence in a short time.

Solution to Problem

An optical sensor according to the present invention includes: a light source that irradiates excitation light; a photodetector that detects radiation light emitted from a detection target excited by the excitation light; and a single light guide unit that guides the excitation light to the detection target and guides the radiation light to the photodetector.

A light detection method according to the present invention includes: irradiating excitation light from a light source; and detecting, through a photodetector, radiation light that has been emitted from a detection target excited by the excitation light passing through a light guide unit and that has passed through the light guide unit.

When the detected phosphorescence is phosphorescence emitted from a single phosphorescent material or a plurality of phosphorescent materials having the same decay time constant, the decay time constant of the phosphorescent material can be determined by detecting the intensity twice changing the detection time, and solving the simultaneous expression representing the relationship between the intensity of phosphorescence and time. However, when the detected phosphorescence is phosphorescence emitted from a plurality of phosphorescent materials having different decay time constants, it is necessary to solve a complex simultaneous expression of exponential functions, making it difficult to determine the decay time constants of the plurality of phosphorescent materials.

Meanwhile, in the determination of the authenticity of security marks and the like, whether the phosphorescence results from multiple types of phosphorescence that emit light within the same wavelength range and have different decay time constants is one of the features, and success in judging it is useful. To be specific, when the detection time is changed and the intensity of phosphorescence is detected at least three times, it can be determined whether the detected phosphorescence results from phosphorescence having a single decay time constant. In other words, it can be determined whether or not the detected phosphorescence results from multiple types of phosphorescence having different decay time constants.

In other words, a phosphorescence detection apparatus according to the present invention solves the aforementioned problem by including: a light source that irradiates a detection target with the excitation light, the detection target containing a phosphorescent material; a photodetector that detects the intensity of phosphorescence emitted from the detection target; and a detection unit that controls the light source and the photodetector, and detects the intensity at least three times after the stop of the irradiation with the excitation light, changing the detection time; and a determination unit that determines whether or not the phosphorescence results from multiple types of phosphorescence having different decay time constants, on the basis of the at least three intensities detected by the detection unit and their detection times.

A phosphorescence detection method according to the present invention solves the aforementioned problem by including: irradiating a detection target with excitation light, the detection target containing a phosphorescent material; detecting the intensity of phosphorescence emitted from the detection target at least three times after the stop of the irradiation with the excitation light, changing the detection time; and determining whether or not the phosphorescence results from multiple types of phosphorescence having different decay time constants, on the basis of the at least three intensities and their detection times.

A phosphorescence detection apparatus according to the present invention includes: a light source that irradiates a detection target with excitation light, the detection target emitting at least one of multiple types of phosphorescence to be recognized; a photodetector that detects the intensity of phosphorescence emitted from the detection target; and a control unit that controls the light source and the photodetector, in which the control unit performs the first detection of the intensity at a first timing after the stop of the irradiation with the excitation light, and performs the subsequent detection of the intensity at a second timing subsequent to the first detection. The second timing is a timing at which the absolute value of a difference in the ratio of the intensity detected in the first detection to the intensity detected in the subsequent detection is greater than or equal to a predetermined value, between at least two of the multiple types of phosphorescence to be recognized.

A phosphorescence detection method according to the present invention includes: irradiating a detection target with excitation light, the detection target emitting at least one of multiple types of phosphorescence to be recognized; stopping the irradiation with the excitation light; performing a first detection of the intensity of phosphorescence emitted from the phosphorescent material contained in the detection target at a first timing after stopping the irradiation with the excitation light; and performing subsequent detection of the intensity at a second timing subsequent to the first detection. The second timing is a timing at which the absolute value of a difference in the ratio of the intensity detected in the first detection to the intensity detected in the subsequent detection is greater than or equal to a predetermined value, between at least two of the multiple types of phosphorescence to be recognized.

Although there are various phosphorescent materials and phosphorescence has various emission colors and decay time constants, here, a phosphorescent material having a decay time constant in the range of 0.2 to 10 msec, which is thought to be a preferable security feature for sheets represented by value documents such as banknotes and securities is regarded a detection target. To be specific, for example, when phosphorescence having a decay time constant in the range of 0.2 to 10 msec is detected with a banknote processing apparatus that conveys a banknote at 4,000 mm/sec, the distance by which the detection target is conveyed and moved until the phosphorescence reaches about 37% of the initial value (1/e of the initial value) is 0.8 to 40 mm. For this reason, when the phosphorescence detectable range of the sensor is about 10 mm to 20 mm in the convey direction of the detection target, phosphorescent materials having the aforementioned decay time constant can be distinguished.

Advantageous Effects of Invention

According to the present invention, excitation light can be guided from the light source to the detection target by using a single light guide unit, and the radiation light can be guided from the detection target to the photodetector, whereby the sensor can be miniaturized and the radiation light reception surface of the sensor can be enlarged at the same time.

According to the present invention, whether or not the detected phosphorescence results from multiple types of phosphorescence that emit light within the same wavelength range and have different decay time constants can be determined.

According to the present invention, an apparatus can be provided which is capable of recognizing recognition target phosphorescence in a short time.

DESCRIPTION OF EMBODIMENTS

The present invention will now be described in detail with reference to the accompanying drawings.

First Embodiment (1) Structure of Optical Sensor

Figure 1:
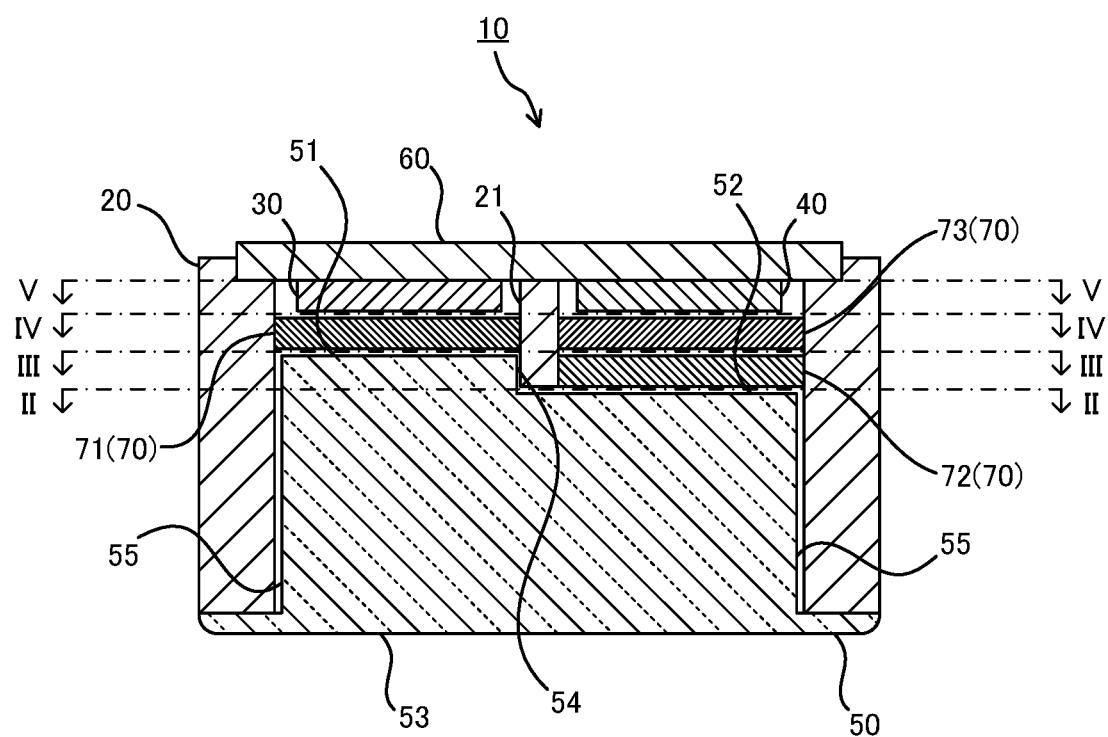
FIG. 1 is a schematic diagram showing the structure of one embodiment of an optical sensor according to the present invention.
Figure 2:
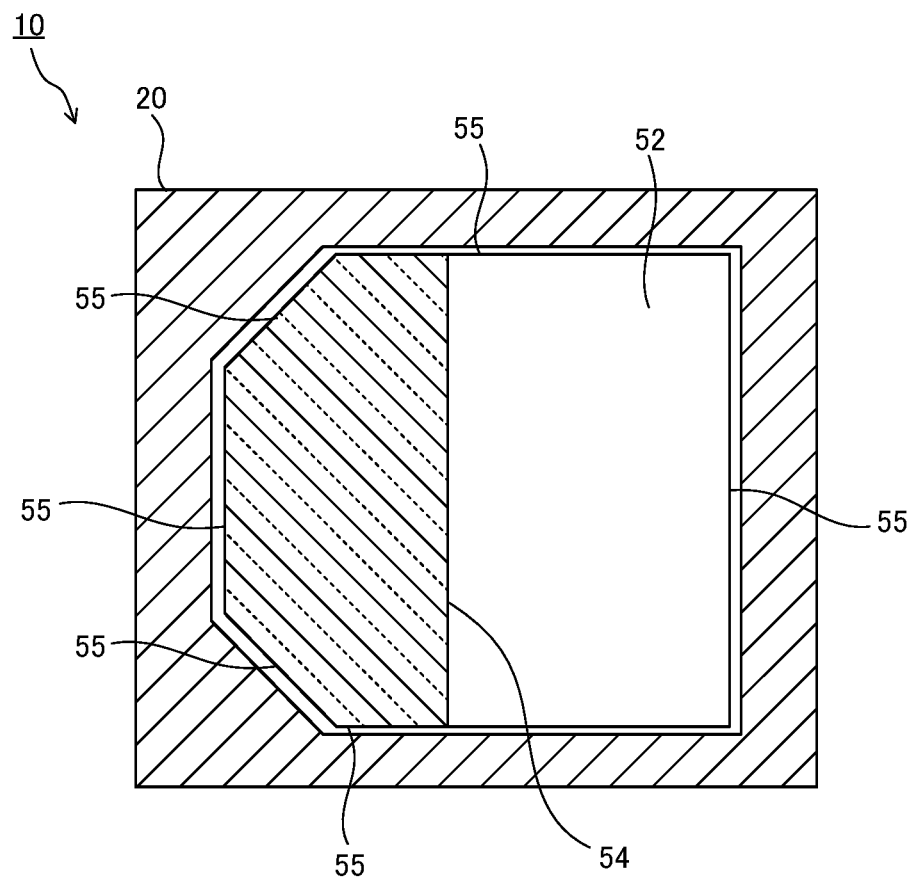
FIG. 2 is a cross-sectional view taken along line II-II in FIG. 1.
Figure 3:
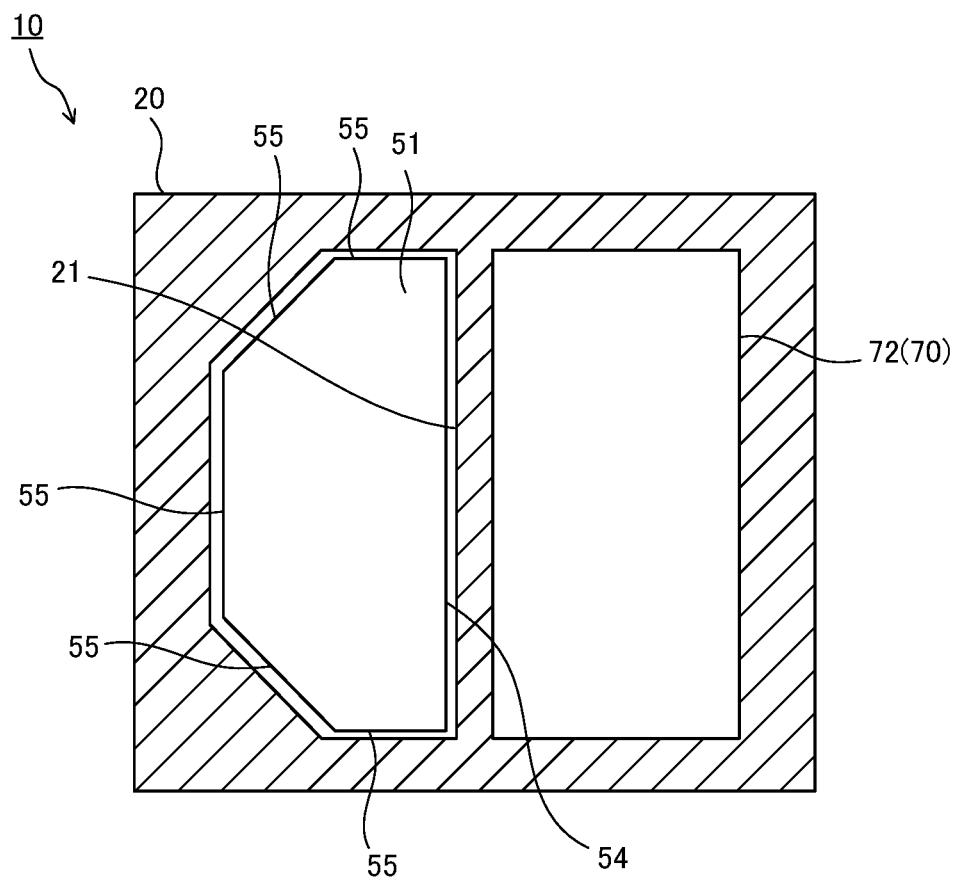
FIG. 3 is a cross-sectional view taken along line in FIG. 1.
Figure 4:
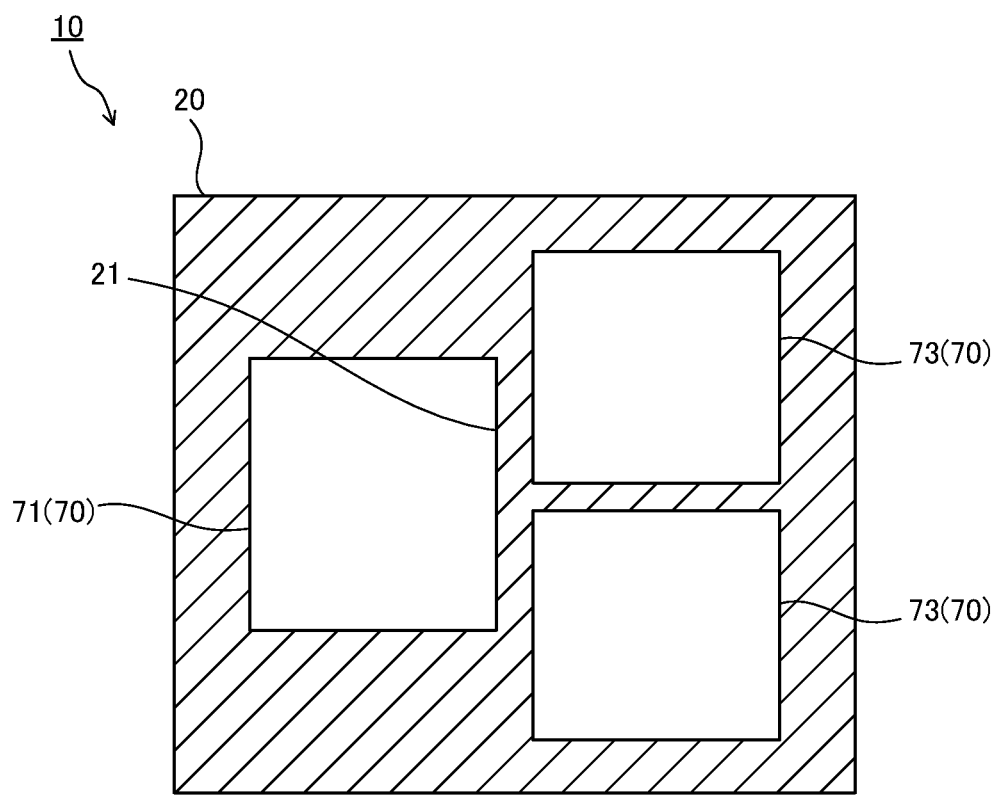
FIG. 4 is a cross-sectional view taken along line IV-IV in FIG. 1.

FIG. 1 is a side cross-sectional schematic view showing the structure of an optical sensor 10 according to an embodiment to which the present invention is applied. FIGS. 2, 3, 4 and 5 are cross-sectional views taken along lines II-II, IV-IV, and V-V in FIG. 1, respectively. Although FIG. 1 shows the case where an optical sensor 10 is attached downward, the optical sensor 10 can be attached in any direction.

The optical sensor 10 includes a holder 20, a light source 30, a photodetector 40, a light guide 50, a board 60, and an optical filter 70.

The holder 20 is composed of a material that does not transmit light, such as black resin, has a through hole opened at the top and bottom, and is a cylindrical unit. In the through hole, the light guide 50, the optical filter 70, the light source 30, and the photodetector 40 are disposed in this order from the lower side. The upper opening of the through hole is closed by the board 60. The holder 20 also has a partition 21 disposed between the light source 30 and the photodetector 40 as its part. When the partition 21 comes in contact with the light guide 50, the surface of the light guide 50 may be scratched, which may cause light leakage, decay, or diffusion, and may degrade the light guide performance of the light guide 50. For this reason, a small gap is provided between the lower end of the partition 21 and the surface of the light guide 50. However, when there is no such risk, the partition 21 may be brought into contact with the light guide 50. Needless to say, the partition 21 may be a member separate from the holder 20.

The light source 30 irradiates the detection target with excitation light. To be specific, the light source 30 is an ultraviolet light LED and is attached to the lower surface of the board 60. The excitation light irradiated by the light source 30 includes a wavelength that can excite the detection target, and desirably does not include the wavelength range of the radiation light to be detected.

Figure 5:
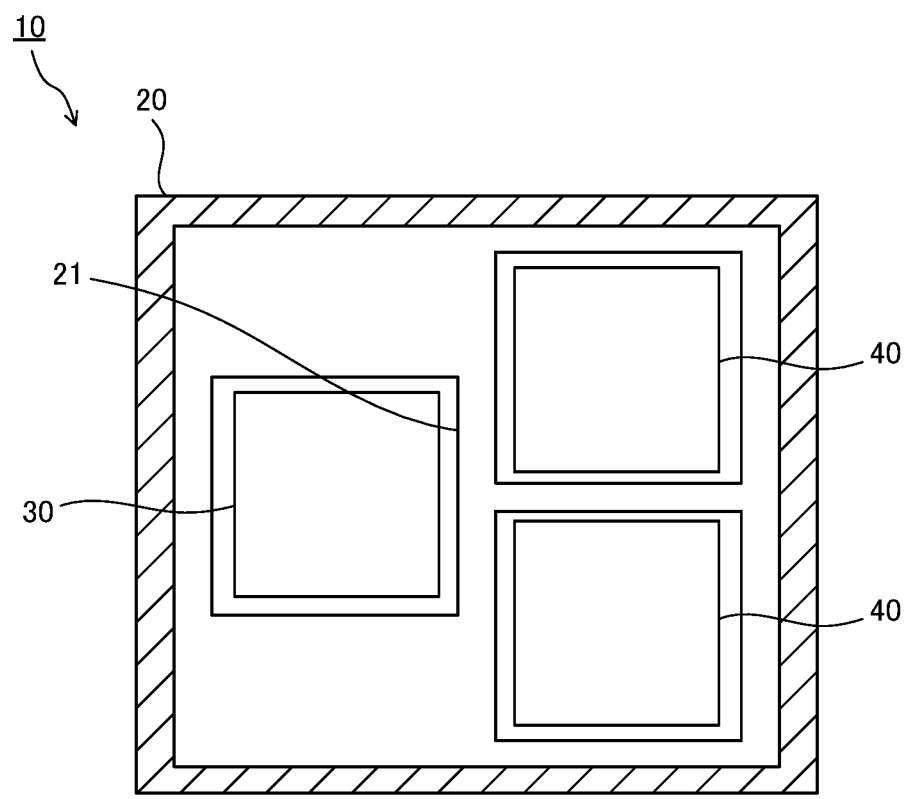
FIG. 5 is a cross-sectional view taken along line V-V in FIG. 1.

The photodetector 40 detects the radiation light emitted from the detection target. To be specific, the photodetector 40 is a photodiode that outputs a signal that changes in accordance with the intensity (light amount) of the received light, and is attached to the lower surface of the board 60. As shown in FIG. 5, the optical sensor 10 includes two photodetectors 40. These photodetectors 40 have different detectable wavelength ranges. This allows two types of radiation light to be detected concurrently. When only radiation light of a specific wavelength is detected or the intensity of the radiation light is detected regardless of the wavelength, the number of photodetectors 40 may be one. Further, setting the number of photodetectors 40 to three or more allows three or more types of radiation light to be detected concurrently.

The light guide 50 guides the excitation light emitted from the light source 30 to the detection target, and guides the radiation light emitted from the detection target to the photodetector 40. In other words, the light guide 50 functions as a light guide unit. The light guide 50 is a block composed of transparent resin such as acrylic or polycarbonate resin, and has an excitation light incident surface 51 and a radiation light emission surface 52 on the top, and a light incident/emission surface 53 on the bottom. The light incident/emission surface 53 is larger than the light receiving surface of the photodetector 40. The light guide 50 has a standing surface 54 between the excitation light incident surface 51 and the radiation light emission surface 52, and a step is formed by the excitation light incident surface 51, the standing surface 54, and the radiation light emission surface 52. In addition, the light guide 50 has a side surface 55 extending between the excitation light incident surface 51 and the radiation light emission surface 52, and the light incident/emission surface 53. A small gap is provided between the side surface 55 and the inner surface of the holder 20. Although not particularly limited, in this embodiment, the shape of the space surrounded by the side surface 55 of the light guide 50 is a hexagonal shape obtained by chamfering two corners adjacent to the substantially square light source 30 as viewed from the light source 30 and the photodetector 40 side. With this shape, the detection target can be efficiently irradiated with the excitation light from the light source 30. The material for the light guide 50 is not limited to transparent resin, and may be transparent glass. Note that the material for the light guide 50 should at least be a material that transmits excitation light and radiation light, and is not limited to a transparent material.

The light source 30 and the excitation light incident surface 51 are disposed so as to face each other via a visible light cut filter 71 which is a type of optical filter 70 and transmits ultraviolet light and cuts visible light. The photodetector 40 and the radiation light emission surface 52 are disposed so as to face each other via an ultraviolet light cut filter 72 and a color filter 73 which are one type of optical filter 70. When a plurality of photodetectors 40 is provided as in the optical sensor 10 according to this embodiment, the types of color filters 73 facing the photodetectors 40 can be changed to allow the photodetectors 40 to detect light of different wavelengths (colors). For example, in the case of detecting red, green, and blue radiation light, a total of three color filters 73 are disposed one by one between the three photodetectors 40 and the radiation light emission surface 52. Each color filter 73 transmits light in the red wavelength region, the green wavelength region, or the blue wavelength region. These optical filters 70 may be replaced with filters of other characteristics according to the purpose, and may not be disposed when unnecessary.

(2) Light Guiding by Light Guide

The ultraviolet light contained in the excitation light emitted from the light source 30 passes through the visible light cut filter 71 and enters the light guide 50 from the excitation light incident surface 51. The partition 21 prevents excitation light before entering the light guide 50 from reaching the photodetectors 40 directly or being reflected by the excitation light incident surface 51 or radiation light emission surface 52. In other words, the partition 21 functions as a light-blocking region.

Figure 6:
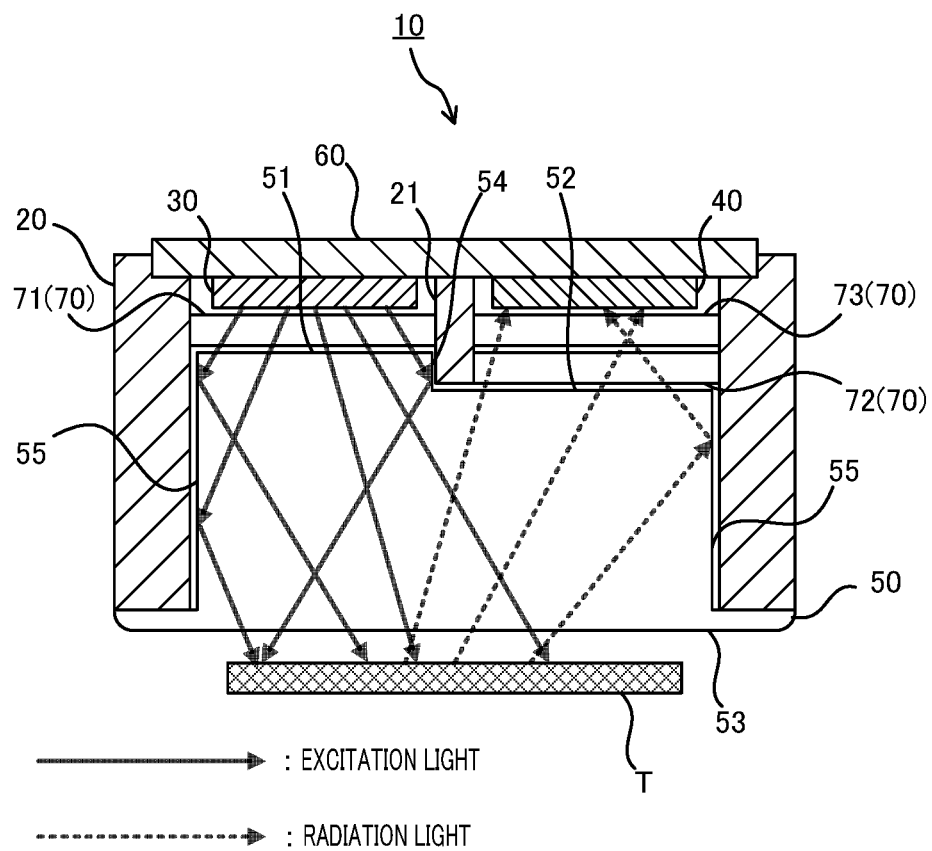
FIG. 6 is a schematic diagram for explaining the scene where light is guided in an optical sensor according to the present invention.

As shown in FIG. 6, the excitation light incident on the light guide 50 is guided within the light guide 50 while being reflected by the standing surface 54 and the side surface 55, and reaches the light incident/emission surface 53. As described above, there is a gap between the partition 21 and the surface of the light guide 50, while there is a step formed by the excitation light incident surface 51, the standing surface 54, and the radiation light emission surface 52, and the excitation light coming from the excitation light incident surface 51 is reflected by the standing surface 54. In other words, the step functions as a light-blocking region. The standing surface 54 also functions to condense excitation light directly below the light source 30.

The excitation light that has reached the light incident/emission surface 53 is emitted from the light incident/emission surface 53. The light incident/emission surface 53 is disposed so as to face the detection target T. The detection target T is a security mark printed on a banknote or the like using an ink containing a material that emits radiation light such as fluorescence or phosphorescence when excited. Consequently, the detection target T is excited by the excitation light emitted from the light incident/emission surface 53, and emits radiation light such as fluorescence or phosphorescence.

Radiation emitted from the detection target T enters the light guide 50 from the light incident/emission surface 53. The radiation light that has entered the light guide 50 is guided within the light guide 50 while being reflected by the side surface 55, and reaches the radiation light emission surface 52. The radiation light that has reached the radiation light emission surface 52 is emitted from the radiation light emission surface 52. Of the radiation light emitted from the radiation light emission surface 52, radiation light of a predetermined color (wavelength) to be detected passes through the ultraviolet light cut filter 72 and the color filter 73 and is detected by the photodetectors 40.

It is possible that the excitation light is reflected on the surface of the detection target T, and the ultraviolet light contained in the reflected excitation light reaches the radiation light emission surface 52 and is emitted from the radiation light emission surface 52, but this ultraviolet light cannot pass through the ultraviolet light cut filter 72 and therefore does not reach the photodetectors 40.

As described above, the optical sensor 10 uses the light guide 50 in the optical system. Therefore, unlike in the case of using a lens, it is not necessary to secure a gap corresponding to the focal distance of the lens in front of the photodetector 40. In addition, the single light guide 50 guides excitation light from the light source 30 to the detection target T and guides radiation light from the detection target T to the photodetector 40. Consequently, the optical sensor 10 has a compact configuration as a whole. Moreover, since radiation light is not condensed on the photodetector 40 unlike in the case of using a lens, the photodetector 40 having a large light receiving surface can be used. Therefore, the optical sensor 10 is suitable for installation in the apparatus and detection of radiation light from the moving detection target T.

Moreover, the radiation light reception surface of the light guide 50, that is, the light incident/emission surface 53 is larger than the light receiving surface of the photodetector 40, and the light guide 50 is configured to guide the radiation light coming from the light incident/emission surface 53 to the photodetector 40. Therefore, the optical sensor 10 has a compact configuration as a whole but has a large light reception area and thus can detect radiation light with high sensitivity. Therefore, even when radiation light is detected while the detection target T is moved as described later, fluctuations in the radiation light intensity (light amount) due to variations in the position of the detection target T can be reduced. In addition, the influence of variations in radiation light intensity due to printing unevenness can also be reduced.

In addition, when there is a hollow portion between the photodetector 40 and the light guide 50 inside the holder 20 as in an optical system using a lens, light incident on the hollow portion is absorbed when colliding with the inner wall of the holder 20 and decays. In contrast, in the optical sensor 10, the inside of the holder 20 is mostly occupied by the light guide 50, so that such absorption and decay of light hardly occur. In addition, since the inside of the holder 20 is mostly occupied by the light guide 50, dust can be prevented from being accumulated inside and light can be prevented from being absorbed in the dust and thus decaying.

Moreover, since the light source 30 and the photodetector 40 are attached to the same board 60 and the board 60 serves as a lid of the holder 20, the cost of the components and the number of manufacturing steps can be reduced and the optical sensor 10 can therefore be manufactured at low cost.

Further, since the photodetector 40 can be separated from the detection target T by at least the height of the light guide 50, the photodetector 40 can be prevented from being affected by the static electricity carried by the detection target T and/or the apparatus for conveying it. Moreover, since the light guide 50 occupies most of the space between the photodetector 40 and the detection target T, the radiation light emitted from the detection target T is also prevented from decaying before reaching the photodetector 40.

As described above, the optical sensor 10 has a large light reception area and is compact. The light detection apparatus can therefore be configured by mounting the optical sensor 10 on an apparatus in which an optical sensor would not conventionally be able to be mounted due to space limitations. An example of such a light detection apparatus is a sheet processing apparatus.

(3) Method of Detecting Radiation Light

A method of detecting radiation light using the optical sensor 10 will now be described. For detection of radiation light using the optical sensor 10, the optical sensor 10 is connected via the board 60 to a control apparatus not shown in FIG. 1. The control apparatus turns on the light source 30 (that is, starts the irradiation of excitation light) and turns off the light source 30 (that is, stops the irradiation of excitation light). In addition, the control apparatus receives a signal transmitted by the photodetector 40 that has detected radiation light and calculates the intensity (light amount) of the radiation light.

(3-1) Method of Detecting Fluorescence

Detection of fluorescence is performed in the following manner. Note that fluorescence is radiation light emitted from the detection target T while the detection target T is irradiated with excitation light. When the irradiation with excitation light is stopped, the emission of fluorescence from the detection target T is also stopped.

First, the light source 30 irradiates excitation light. The irradiated excitation light passes through the light guide 50. The excitation light that has passed through the light guide 50 reaches the detection target T and excites the detection target T. The excited detection target T emits fluorescence. The fluorescence emitted from the detection target T passes through the light guide 50. The photodetector 40 detects the fluorescence that has passed through the light guide 50.

The photodetector 40 that has detected the fluorescence transmits a signal for informing the detection of the fluorescence or a signal that changes according to the intensity of the detected fluorescence to the control apparatus. The control apparatus that has received the signal from the photodetector 40 calculates the intensity of the fluorescence and the like. Thus, the fluorescence is detected.

Fluorescence can be detected at any timing and time during irradiation with excitation light. The intensity of the fluorescence to be detected may be calculated from the signal obtained by one measurement performed during detection, or may be calculated by integrating or averaging the signals obtained by a plurality of measurements that was performed during detection.

(3-2) Method of Detecting Phosphorescence

Detection of phosphorescence is performed in the following manner. Note that phosphorescence is radiation light emitted from the detection target T after the irradiation of excitation light onto the detection target T is stopped. The intensity of phosphorescence emitted from the detection target T gradually decays with time after the irradiation of the excitation light is stopped.

First, the light source 30 irradiates excitation light. The irradiated excitation light passes through the light guide 50. The excitation light that has passed through the light guide 50 reaches the detection target T and excites the detection target T. Subsequently, the light source 30 is turned off. Then, the excited detection target T emits phosphorescence. The phosphorescence emitted from the detection target T passes through the light guide 50. The photodetector 40 detects the phosphorescence that has passed through the light guide 50.

The photodetector 40 that has detected the phosphorescence transmits a signal for informing the detection of the phosphorescence or a signal that changes according to the intensity of the detected phosphorescence to the control apparatus. The control apparatus that has received the signal from the photodetector 40 calculates the intensity of the phosphorescence and the like. Thus, the phosphorescence is detected.

It is preferable that the detection of phosphorescence be started immediately after the irradiation with the excitation light is stopped. Although the detection time of phosphorescence can be arbitrarily set, when the decay time constant is calculated as described later, the decay time constant can be calculated more accurately as the detection time is shortened. The intensity of the phosphorescence to be detected may be calculated from the signal obtained by one measurement performed during detection, or may be calculated by integrating or averaging the signals obtained by a plurality of measurements that was performed during detection.

Note that each phosphorescence emitting material has a unique phosphorescence intensity decay time constant (a time required for the phosphorescence intensity to be 1/e). In other words, the phosphorescence intensity decay curve, which is represented by a coordinate system having a horizontal axis representing the time elapsed after the turning-off of the light source 30 and a vertical axis representing the phosphorescence intensity, differs depending on each phosphorescence emitting material. Accordingly, after the turning-off of the light source 30, the phosphorescence emitting material contained in the detection target T can be determined by calculating the phosphorescence intensity many times and comparing each calculated phosphorescence intensity with the reference phosphorescence intensity.

It is also possible to determine the phosphorescence emitting material contained in the detection target T by calculating the decay time constant of the phosphorescence intensity and comparing the calculated decay time constant with a reference decay time constant. The decay time constant of the phosphorescence intensity can be calculated based on the following Expression 3 by detecting the phosphorescence intensity twice after the turning-off of the light source 30.

[Expression 3]

$$\tau = -(t_2 - t_1)/\ln(P_2/P_1) \quad (3)$$

In Expression 3, $\tau$ is the decay time constant of the phosphorescence intensity. In addition, $t_1$ and $t_2$ are the times that have elapsed after the turning-off of the light source 30 until the first and second phosphorescence detections, respectively. $P_1$ and $P_2$ are the intensities of phosphorescence detected at the first and second times, respectively.

It is also possible to determine whether the detection target T contains multiple types of phosphorescence emitting material having different decay time constants by calculating the phosphorescence intensity at least three times after the turning-off of the light source 30.

(3-3) Method of Detecting Radiation Light Emitted from Moving Detection Target In addition, use of the optical sensor 10 allows radiation light emitted from the moving detection target T to be detected. The method will be described with reference to FIGS. 7A and 7B which schematically show the positional relationship between the optical sensor 10 and the detection target T.

Figure 7A:
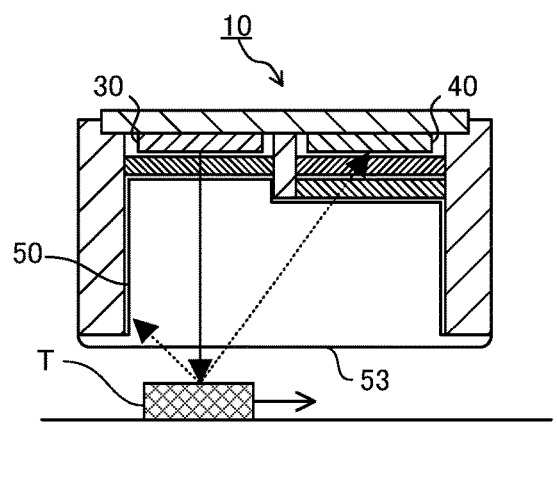
FIG. 7A is an explanatory diagram for explaining a method of detecting radiation light from a moving detection target.

When the radiation light emitted from the moving detection target T is detected, the optical sensor 10 is disposed such that the light incident/emission surface 53 faces the conveyance path of the detection target T. As shown in FIG. 7A, when the detection target T is conveyed to a position facing the light incident/emission surface 53 and in front of, for example, the light source 30, the light source 30 irradiates excitation light. The irradiated excitation light passes through the light guide 50. The excitation light that has passed through the light guide 50 reaches the detection target T and excites the detection target T.

When fluorescence is emitted from the detection target T, the fluorescence passes through the light guide 50. The photodetector 40 detects the fluorescence that has passed through the light guide 50.

Figure 7B:
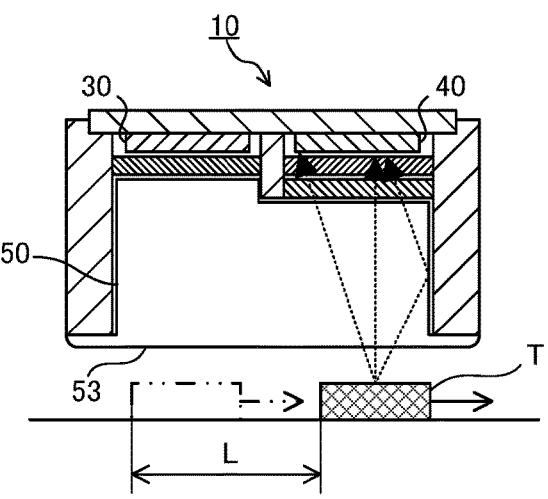
FIG. 7B is an explanatory diagram for explaining a method of detecting radiation light from a moving detection target.

Subsequently, the light source 30 is turned off. When phosphorescence is emitted from the detection target T, the phosphorescence passes through the light guide 50. The photodetector 40 detects the phosphorescence that has passed through the light guide 50. At this time, as shown in FIG. 7B, the detection target T has moved by a distance L downstream in its moving direction.

Although the detection target T moves during the period from the irradiation of the excitation light by the light source 30 to the detection of fluorescence or phosphorescence, since the light incident/emission surface 53 is large, the light guide 50 allows these radiation light to enter the light guide 50. In addition, when radiation light enters the light guide 50, the light guide 50 can guide the radiation light to the photodetector 40. Accordingly, the optical sensor 10 can detect radiation light even when the detection target T is moving. Note that, depending on the travel speed of the detection target T and the size of the light incident/emission surface 53, it is preferable that phosphorescence emitted after the emission of excitation light is stopped be detected 0 to 3.0 msec after the turning-off of the light source 30.

Figure 8:
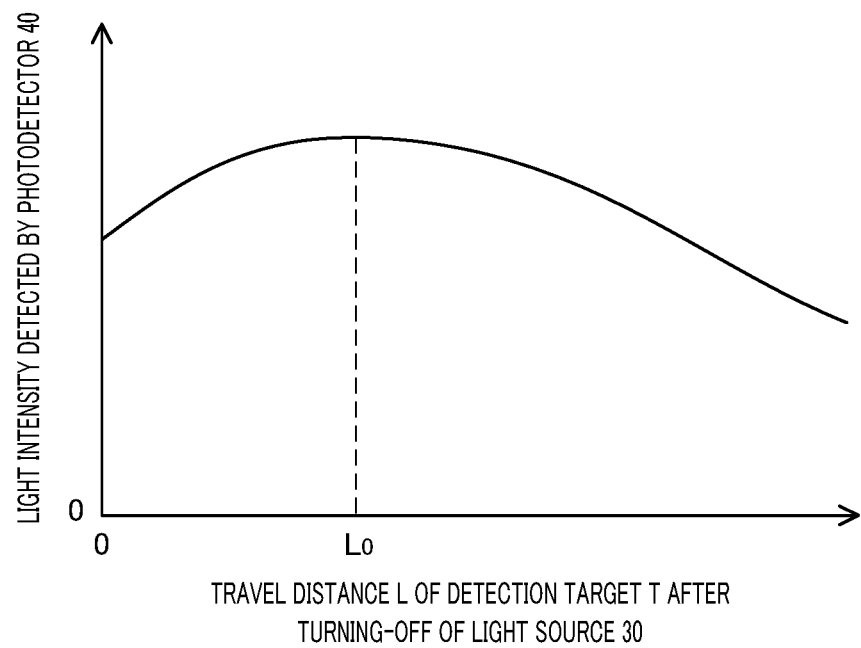
FIG. 8 is a graph showing the relationship between the travel distance of the detection target and the detected intensity after turning-off of the light source.

Note that, as shown in FIG. 8, the intensity of the radiation light detected by the photodetector 40 changed depending on the relative position between the detection target T emitting radiation light and the photodetector 40, that is, the distance L by which the detection target T moved after the turning-off of the light source 30. FIG. 8 schematically shows a curve showing the relationship between the travel distance L of the detection target T after the turning-off of the light source 30 and the intensity of phosphorescence detected by the photodetector 40, assuming that the intensity of phosphorescence emitted from the detection target T is always constant.

As shown in FIG. 8, the intensity of phosphorescence detected by the photodetector 40 reaches a maximum when the distance L becomes a predetermined value $L_0$, and decreases as the distance L gets away from $L_0$.

When the travel speed of the detection target T is constant, the relative positions of the detection target T and the photodetector 40 can be always kept constant by detecting phosphorescence at a predetermined timing after the turning-off of the light source 30. However, it is difficult in some cases to always keep the relative positions of the detection target T and the photodetector 40 constant due to, for example, fluctuations in the speed of the apparatus that conveys the detection target T. In this case, the relative positions of the detection target T and the photodetector 40 fluctuate, so that the phosphorescence intensity cannot be accurately detected.

Accordingly, in order to accurately detect the intensity of radiation light, the intensity of the detected radiation light is preferably corrected according to the relative positions of the detection target T and the photodetector 40.

For this reason, the control apparatus can correct the intensity of phosphorescence by storing information on the curve illustrated in FIG. 8, obtaining a correction coefficient from the information and the distance L by which the detection target T moved after the turning-off of the light source 30 and before the detection of the phosphorescence, and multiplying the detected phosphorescence intensity by this correction coefficient. As such information, the control apparatus can store, for example, a function or table representing the relationship between the distance L by which the detection target T moved after the turning-off of the light source 30 and before the detection of the phosphorescence and the intensity of the phosphorescence detected by the photodetector 40.

The corrected phosphorescence intensity is compared with a reference value, so that the phosphorescence emitting material included in the detection target T can be determined more accurately. Thus, the authenticity of the detection target T or a sheet, a product, or the like provided with the detection target T can be determined.

In addition, the phosphorescence emitting material contained in the detection target T can also be determined by calculating the decay time constant of the phosphorescence intensity based on the corrected phosphorescence intensity, and comparing the calculated decay time constant with a reference decay time constant. The decay time constant based on the corrected phosphorescence intensity can be calculated using the following Expression 4 by detecting the phosphorescence intensity twice after the turning-off of the light source 30.

[Expression 4]

$$\tau = -(t_2 - t_1)/\ln\{P_2 * Y(L_2)/P_1 * Y(L_1)\} \quad (4)$$

In Expression 4, τ is the decay time constant of the phosphorescence intensity. In addition, $t_1$ and $t_2$ are the times that have elapsed after the turning-off of the light source 30 until the first and second phosphorescence detections, respectively. $P_1$ and $P_2$ are the intensities of phosphorescence detected at the first and second times, respectively. Y is a function representing the relationship between the travel distance of the detection target T after the turning-off of the light source 30 and the intensity of phosphorescence detected by the photodetector 40. $L_1$ and $L_2$ are the travel distances of the detection target T after the turning-off of the light source 30 until the first and second phosphorescence detections, respectively.

As described above, with the optical sensor 10, radiation light can be detected while the detection target T is moved, and the intensity of phosphorescence can be corrected according to the position of the detection target T. Consequently, the detection of the radiation light from the detection target T and the determination of the phosphorescence emitting material contained in the detection target T can be performed quickly and accurately.

(4) Structure of Light Detection Apparatus

Figure 9:
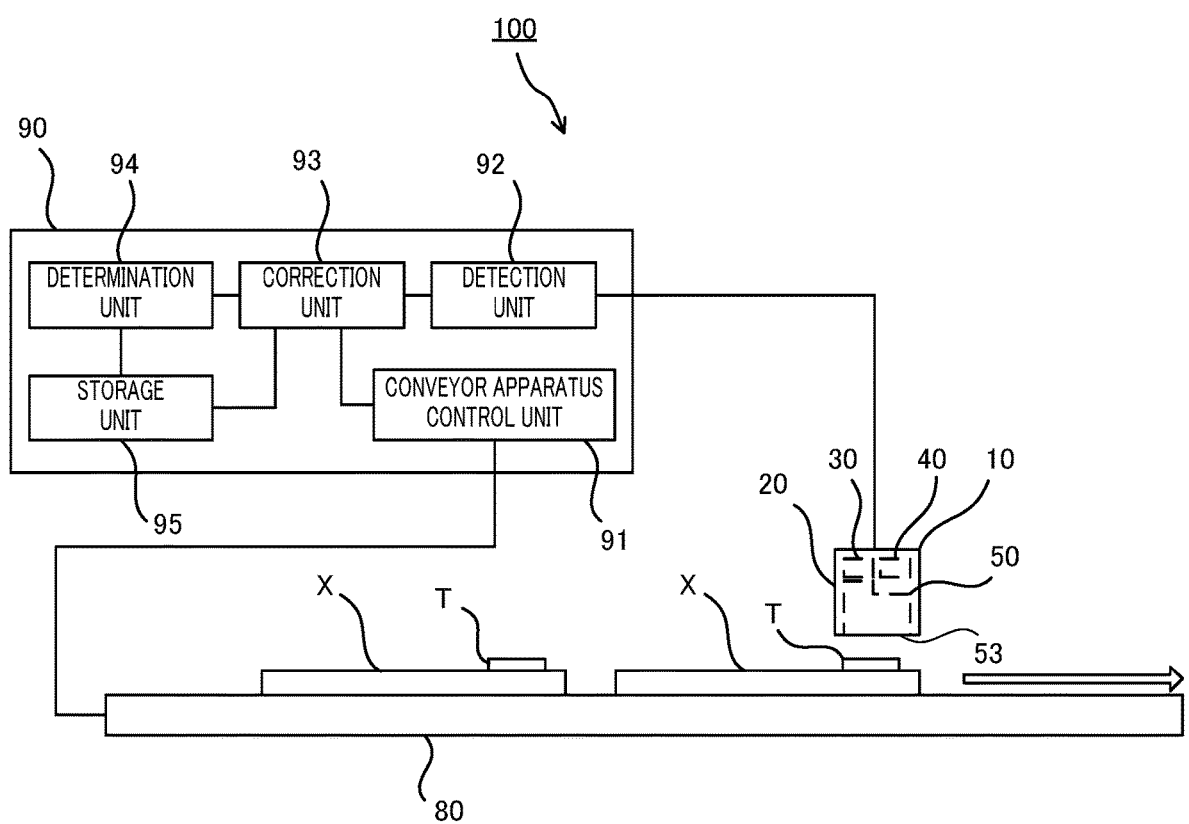
FIG. 9 is a schematic diagram showing the structure of one embodiment of a light detection apparatus according to the present invention.

A light detection apparatus mounted with the optical sensor 10 will now be described. FIG. 9 is a block diagram schematically showing the structure of the light detection apparatus 100. The light detection apparatus 100 is an apparatus used to determine the authenticity of the detection target T attached to an object X to be conveyed. The light detection apparatus 100 includes a conveyor apparatus 80, an optical sensor 10 installed above the conveyor apparatus 80, and a control apparatus 90 that controls the conveyor apparatus 80 and the optical sensor 10. The light detection apparatus 100 can be used as a sheet processing apparatus, treating the object X to be conveyed as a sheet such as a banknote. Note that the light detection apparatus 100 functions as a phosphorescence detection apparatus when detecting phosphorescence as radiation light.

The conveyor apparatus 80 is an apparatus for continuously conveying the object X to be conveyed having the detection target T in a predetermined position, in the direction indicated by the arrow, and can be a belt conveyor, a roller conveyor, a floating conveyor apparatus or the like selected according to characteristics such as the shape of the object X to be conveyed. In this embodiment, the conveyor apparatus 80 is a belt conveyor. The belt conveyor has a belt and a pulley for driving the belt. A rotary encoder that detects the number of rotations (rotational angle) of the pulley is connected to the rotating shaft of the pulley. The conveyor apparatus 80 has, upstream from the optical sensor 10, a passage detection sensor (not shown in the drawings) for detecting the passage of the object X to be conveyed.

In the light detection apparatus 100, the optical sensor 10 is disposed such that the light source 30 is located upstream in the conveyance direction of the object X to be conveyed in the conveyor apparatus 80 and the photodetector 40 is located downstream in the same direction. In addition, the optical sensor 10 is disposed such that the light incident/emission surface 53 of the light guide 50 faces the detection target T attached to the object X to be conveyed on the conveyor apparatus 80.

The control apparatus 90 consists of a power supply, a CPU, a memory, and the like, and includes a conveyor apparatus control unit 91, a detection unit 92, a correction unit 93, a determination unit 94, and a storage unit 95 as functional units.

The conveyor apparatus control unit 91 controls the operation of the conveyor apparatus 80. Further, the conveyor apparatus control unit 91 calculates the travel distance of the belt, that is, the travel distance of the detection target T (information on the location of the detection target T) based on the number of pulses of the rotary encoder observed after the detection of the passage of the object X to be conveyed by the passage detection sensor.

The detection unit 92 instructs the light source 30 to irradiate excitation light and stop the irradiation at a predetermined timing after the detection of the passage of the object X to be conveyed by the passage detection sensor. The detection unit 92 also receives the signal transmitted from the photodetector 40 and calculates the intensity of the detected radiation light.

The correction unit 93 obtains, from the conveyor apparatus control unit 91, information on the location of the detection target T, and obtains, from the detection unit 92, information on the intensity of the radiation light detected by the photodetector 40. The correction unit 93 further obtains information on the correction coefficient from the storage unit 95 which will be described later. The correction unit 93 corrects the intensity of the detected radiation light based on these pieces of information.

The determination unit 94 compares the intensity of the radiation light obtained by the detection unit 92 or the intensity of the radiation light obtained by the correction unit 93 after correction with the reference value stored in the storage unit 95, thereby determining the material contained in the detection target T and determining the authenticity of the detection target T. The determination unit 94 can also calculate the decay time constant τ of the phosphorescence, thereby determining the material contained in the detection target T based on the decay time constant τ and determining the authenticity of the detection target T.

The storage unit 95 stores information on a correction coefficient used to correct the radiation light intensity. This information is, for example, a function or a table indicating the relationship between the relative positions of the photodetector 40 and the detection target T, and the correction coefficient.

In addition, the storage unit 95 stores information such as the intensity of the radiation light emitted from the true detection target T and the decay time constant of the phosphorescence. These pieces of information form the basis for determining the authenticity of the detection target T.

(5) Operation of Light Detection Apparatus

An example of the operation flow of the light detection apparatus 100 with the structure described above will be described with reference to FIG. 10.

When the operation of the light detection apparatus 100 is started, the conveyor apparatus 80 conveys the object X to be conveyed, and the passage detection sensor detects the passage of the object X to be conveyed (S1).

After the passage detection sensor detects the passage of the object X to be conveyed, the light source 30 is turned on when the number of pulses of the rotary encoder reaches a predetermined number (S2). At this time, the detection target T attached to the object X to be conveyed has moved to under the optical sensor 10. The excitation light irradiated from the light source 30 is guided to the detection target T by the light guide 50 to excite the detection target T. While the excitation light is irradiated, fluorescence is emitted from the detection target T.

The photodetector 40 then detects the fluorescence (S3).

After a lapse of a predetermined period of time from the start time of the turning-on of the light source 30, the light source 30 is turned off (S4). Accordingly, the emission of fluorescence from the detection target T is stopped. In addition, the emission of phosphorescence from the detection target T starts.

Subsequently, after the light source 30 is turned off, each of the plurality of photodetectors 40 detects phosphorescence emitted from the detection target T more than once at predetermined timings (S5).

The intensity of the fluorescence and the decay characteristics of the phosphorescent are detected for each photodetector 40 (for each color of radiation light) and, based on them, the material contained in the detection target T is determined and the authenticity of the object X to be conveyed is determined (S6).

Note that the operation of the light detection apparatus 100 is not limited to one that detects fluorescence or phosphorescence once as described above. In other words, fluorescence or phosphorescence may be detected more than once while the object X to be conveyed is passing. Aside from that, the authenticity of the object X to be conveyed can be determined by irradiating, with excitation light, a portion of the object X to be conveyed to which the detection target T should not be attached, and confirming that no radiation light is emitted. Alternatively, the authenticity of the object X to be conveyed can be determined by irradiating, with excitation light, both a portion to which the detection target T should be attached and a portion to which the detection target T should not be attached, for each object X to be conveyed. In this case, when it is confirmed that radiation light is emitted from the portion to which the detection target T should be attached and no radiation light is emitted from the portion to which the detection target T should not be attached, the object X to be conveyed is determined to be true, otherwise it is determined to be false.

(6) Another Embodiment of Optical Sensor

Figure 11:
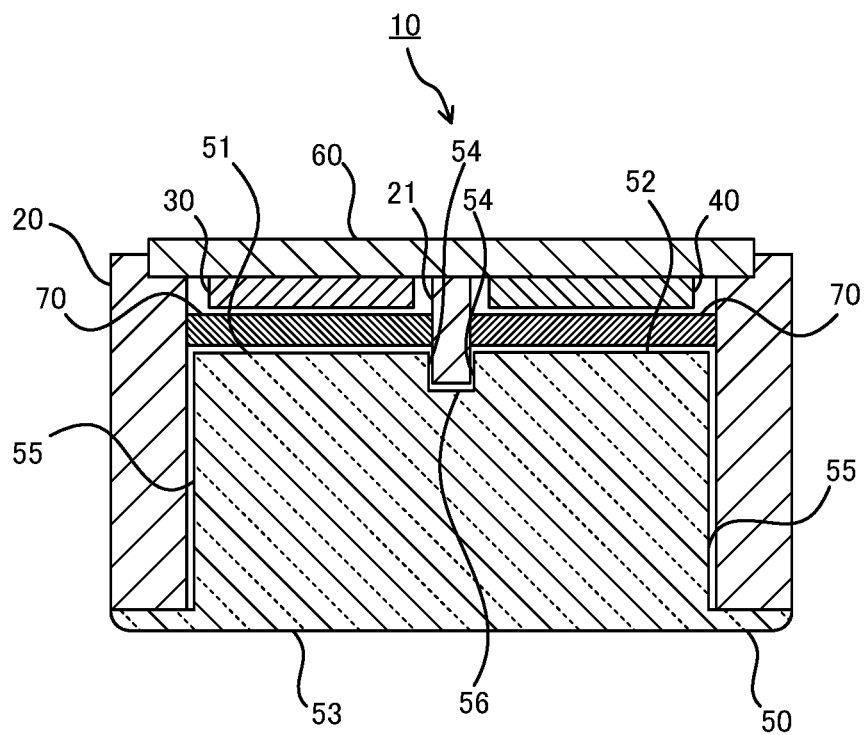
FIG. 11 is a schematic diagram showing the structure of another embodiment of an optical sensor according to the present invention.

The optical sensor 10 to which the present invention is applied is not limited to that shown in FIG. 1. For example, the heights of the excitation light incident surface 51 and the radiation light emission surface 52 are changed according to the presence or absence of the optical filter 70 disposed between the light guide 50 and the light source 30 and the photodetector 40, and the thicknesses thereof, so that the optical sensor 10 can be made more compact without creating unnecessary space between the light guide 50 and the light source 30 and the photodetector 40. To be specific, the optical sensor 10 may be provided with a light guide 50 having a step that is low on the excitation light incident surface 51 side and high on the radiation light emission surface 52 side. Alternatively, as shown in FIG. 11, the optical sensor 10 may be provided with a light guide 50 in which the excitation light incident surface 51 and the radiation light emission surface 52 are flush. In this case, an intermediate surface 56, which is one step lower, is formed between the excitation light incident surface 51 and the radiation light emission surface 52, thereby forming a step portion functioning as a light-blocking region.

Figure 12:
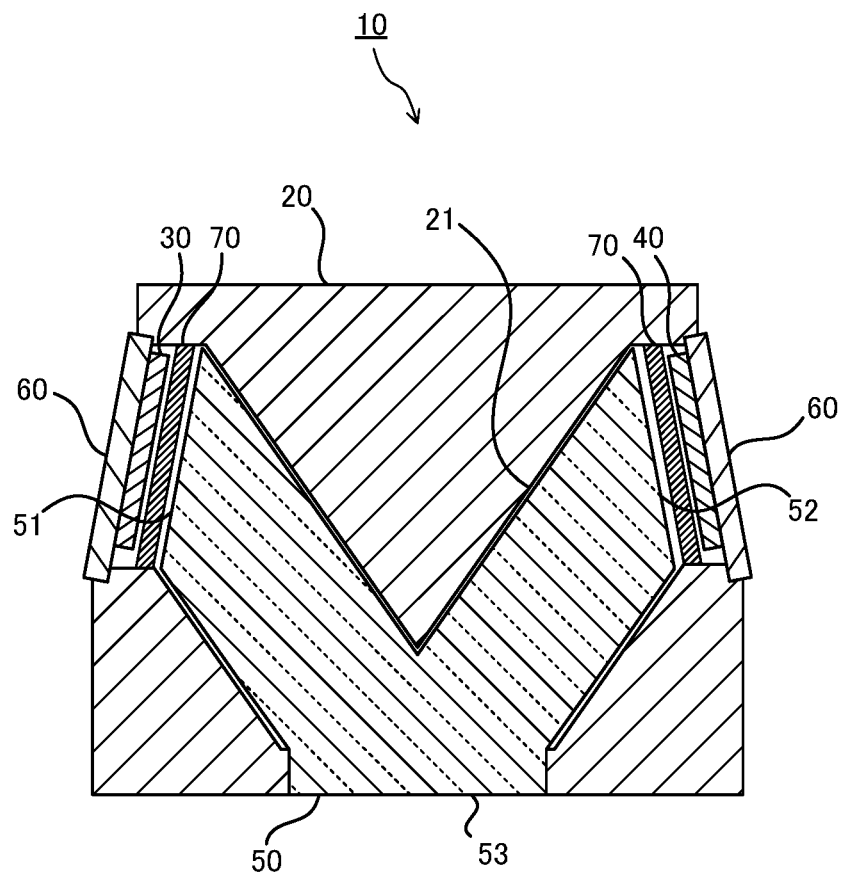
FIG. 12 is a cross-sectional view showing the structure of still another embodiment of an optical sensor according to the present invention.

Further, in the optical sensor 10 to which the present invention is applied, the light guide 50 is not necessarily disposed in a position between the light source 30 and the photodetector 40 and the detection target T facing the optical sensor 10 as long as it can guide the excitation light from the light source 30 to the detection target T and can guide the radiation light from the detection target T to the photodetector 40. For example, as shown in FIG. 12, the light guide 50 may have an excitation light incident surface 51 and a radiation light emission surface 52 at the front and back, and a light incident/emission surface 53 at the lower side.

Further, the optical sensor 10 to which the present invention is applied does not necessarily include the light guide 50 as long as it includes a light guide unit that can guide the excitation light from the light source 30 to the detection target T and can guide the radiation light from the detection target T to the photodetector 40. For example, the optical sensor 10 shown in FIG. 13 may be used.

Figure 13:
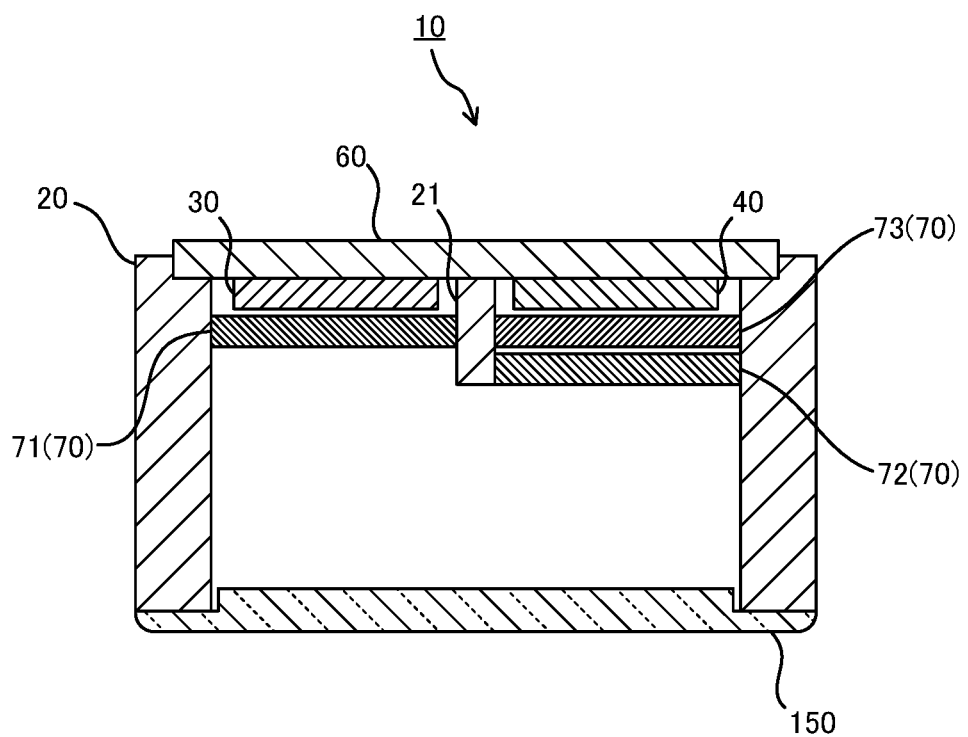
FIG. 13 is a cross-sectional view showing the structure of still another embodiment of an optical sensor according to the present invention.

The optical sensor 10 shown in FIG. 13 differs from the optical sensor 10 shown in FIG. 1 in that it does not include the light guide 50, in that the opening of the through-hole in the cylindrical holder 20 is occluded at the lower side by the cover 150 composed of a material that transmits excitation light and radiation light, and in that the inner surface of the cylindrical holder 20 is a reflective surface.

The reflective surface of the inner surface of the cylindrical holder 20 is, for example, a mirror surface. The mirror surface is formed by coating the inner surface of the holder 20 with a metal such as aluminum or silver or an alloy thereof, and finishing the surface of the metal by a known method. Needless to say, the reflective surface of the inner surface of the cylindrical holder 20 is not limited to the mirror surface formed by the above-described method, as long as most of the excitation light and the radiation light is reflected. In addition, the cylindrical holder 20 can work well even with, for example, a slit or a hole from which part of excitation light or reflective light leaks exists in a part of the cylindrical unit, as long as most of it is covered and the amount of leakage of excitation light or reflective light is small. Note that the inner surface of the holder 20 also includes the side surface and the lower surface of the partition 21.

In the optical sensor 10 shown in FIG. 13, the excitation light irradiated from the light source 30 travels toward the cover 150 while being substantially totally reflected by the inner surface of the holder 20 (including the side surface of the partition 21). The excitation light reaching the cover 150 passes through the cover 150 and excites the detection target T. The excited detection target T emits radiation light. The radiation light emitted from the detection target T passes through the cover 150 and travels toward the photodetector 40 while being substantially totally reflected by the inner surface of the holder 20 (including the side surface of the partition 21).

In other words, in the optical sensor 10 shown in FIG. 13, the holder 20 guides the excitation light from the light source 30 to the detection target T, and guides the radiation light from the detection target T to the photodetector 40. In other words, the holder 20 functions as a light guide unit. The shape of the inner surface of the holder 20 may be, but not limited to, a hexagonal shape obtained by chamfering two corners adjacent to the substantially square light source 30 as viewed from the light source 30 and the photodetector 40 side. With this shape, the detection target T can be efficiently irradiated with the excitation light from the light source 30.

Note that the partition 21 forms a step unit defined by the lower surface, a pair of side surfaces that face each other, and the member (in the case shown in FIG. 13, the board 60) that covers the upper opening of the through hole in the holder 20. Accordingly, in the optical sensor 10 shown in FIG. 13, the partition 21 functions as a light-blocking region that prevents excitation light emitted from the light source 30 from directly reaching the photodetector 40 between the portion adjacent to the light source 30 and the portion adjacent to the photodetector 40 inside the holder 20.

Note that the cover 150 may have any shape that can close the lower opening of the through hole in the holder 20, transmit excitation light toward the detection target T, and transmit radiation light toward the through hole in the holder 20. For example, a flat plate that has no protrusion extending into the holder 20 may be used. Alternatively, the protrusion extending into the holder 20 may be thickened to provide the function of a light guide unit. In other words, the light guide unit may consist of the inner surface of the holder 20 and the protrusion of the cover 150 so that excitation light and radiation light can be guided using the reflection on the inner surface of the holder 20 and the reflection on the side surface of the protrusion of the cover 150.

The optical sensor and the light detection apparatus according to the present invention, which detect a light-emitting material attached as a security feature to the surface of value documents such as banknotes or securities, irradiate the light-emitting material, which serves as a detection target, with excitation light and detect radiation light, such as fluorescence or phosphorescence, emitted from the light-emitting material. The characteristics of radiation light, such as the spectra of fluorescence and phosphorescence and the decay characteristics of phosphorescence, depend on the composition of the light-emitting material, so that the authenticity of the security feature can be determined by detecting radiation light and comparing the characteristics.

Further, the optical sensor according to the present invention is not limited to one having one set of light source 30 and photodetector 40, and may have a so-called line sensor structure in which multiple sets of light source 30 and photodetector 40 are arranged in a line.

Moreover, the light detection apparatus of the present invention may be one in which a plurality of optical sensors 10 is disposed or one in which one optical sensor 10 is disposed. In this case, multiple optical sensors 10 can scan a plurality of positions of one object X to be conveyed and detect radiation light in each position.

Although the embodiment of the present invention have been described so far, the present invention is not limited to the aforementioned embodiments and various modifications can be made without departing from the scope of the present invention.

Second Embodiment (1) Decay Characteristics of Phosphorescent

First, decay characteristics of the phosphorescence emitted from a phosphorescent material will be briefly described.

Phosphorescent materials are materials that are excited upon reception of excitation light, such as visible light and ultraviolet light, and emit phosphorescence. The intensity (light amount) of the phosphorescence emitted from a phosphorescent material reaches a maximum at the end of the irradiation with excitation light and then gradually attenuates. The color and decay time constant of the phosphorescence emitted from a phosphorescent material depends on each phosphorescent material. Even different phosphorescent materials may have the same phosphorescent color or/and decay time constant. In addition, the number of types of phosphorescence emitted from a single phosphorescent material is not always one and may be more than one. The following description is based on the assumption that one type of phosphorescence is emitted from a phosphorescent material for the sake of simplicity. Moreover, even phosphorescence having different apparent phosphorescent colors is treated as phosphorescence within the same wavelength range as long as it is within the wavelength range detectable by a photodetector such as a photodetector 40. The relationship between the intensity of phosphorescence emitted from a single phosphorescent material α and time is represented by Expression 5.

[Expression 5]

$$P_\alpha = A_\alpha \exp(-t/\tau_\alpha) \quad (5)$$

In Expression 5, $P_\alpha$ is the intensity of phosphorescence emitted from a phosphorescent material α, $A_\alpha$ is a constant determined by the concentration and the emission efficiency of the phosphorescent material α, t is the time elapsed from the time of the turning-off of excitation light to the time of detection, and $\tau_\alpha$ is the decay time constant of the phosphorescence emitted from the phosphorescent material α. The relationship between the phosphorescence intensity $P_\alpha$ and the time t is a curve like $L_\alpha$ shown in FIG. 14. The curve $L_\alpha$ is normalized with a maximum intensity of 1.

When the phosphorescence emitted from the phosphorescent material α and the phosphorescent material β have the same decay time constant and have a wavelength within a wavelength range detectable by a photodetector, such as the photodetector 40, the relationship between the intensity of phosphorescence emitted from their mixture and time is expressed by Expression 6.

[Expression 6]

$$P_{\alpha+\beta} = A_\alpha \exp(-t/\tau_\alpha) + A_\beta \exp(-t/\tau_\alpha) \qquad (6)$$
$$= (A_\alpha + A_\beta)\exp(-t/\tau_\alpha)$$

In Expression 6, $P_{\alpha+\beta}$ is the intensity of phosphorescence emitted from a mixture of the phosphorescent material c and the phosphorescent material β, $A_\alpha$ and $A_\beta$ are constants determined by the concentrations and the emission efficiencies of the phosphorescent material c and the phosphorescent material β, t is the time elapsed from the time of the turning-off of excitation light to the time of detection, and $\tau_\alpha$ is the decay time constant of the phosphorescence emitted from the phosphorescent material c and the phosphorescence emitted from the phosphorescent material β. The relationship between the phosphorescence intensity $P_{\alpha+\beta}$ and the time t normalized with a maximum intensity of 1 is a curve like $L_\alpha$ shown in FIG. 14.

In other words, a normalized curve showing the relationship between the intensity of phosphorescence emitted from a single phosphorescent material c and time, and a normalized curve showing the relationship between the intensity of phosphorescence emitted from a mixture of the phosphorescent material c and the phosphorescent material β that have the same decay time constant are identical. Such a relationship between the intensity of phosphorescence and time is achieved even when three or more phosphorescent materials constitute the mixture as long as the decay time constants of phosphorescence emitted from the respective phosphorescent materials are equal and their wavelengths fall within a wavelength range detectable by a photodetector such as the photodetector 40. Therefore, this description takes a single phosphorescent material c as an example of phosphorescent material representing a single phosphorescent material and a mixture of a plurality of phosphorescent materials that have the same decay time constant.

On the other hand, the relationship between the intensity of phosphorescence emitted from a mixture of two types of phosphorescent material γ and δ having different decay time constants, and time is represented by Expression 7.

[Expression 7]

$$P_{\gamma+\delta} = A_\gamma \exp(-t/\tau_\gamma) + A_\delta \exp(-t/\tau_\delta) \qquad (7)$$

In Expression 7, $P_{\gamma+\delta}$ is the intensity of phosphorescence emitted from a mixture of the phosphorescent material γ and the phosphorescent material δ, $A_\gamma$ and $A_\delta$ are constants determined by the concentrations and the emission efficiencies of the phosphorescent material γ and the phosphorescent material δ, t is the time elapsed from the time of the turning-off of excitation light to the time of detection, and $\tau_\gamma$ and $\tau_\delta$ are the decay time constants of the phosphorescence emitted from the phosphorescent material γ and the phosphorescent material δ. The relationship between the phosphorescence intensity $P_{\gamma+\delta}$ and the time t is a curve like $L_{\gamma+\delta}$ shown in FIG. 14. Note that $L_{\gamma+\delta}$ is normalized with a maximum intensity of 1.

The following description is based on the assumption that the time when phosphorescence is detected is time $t_n$ with respect to the time t in Expressions 5 to 7 described above. The time $t_n$ is the time elapsed from the time of the turning-off of excitation light to the time of detection, and when the excitation light is turned off is $t_0=0$. The detection time may be a time that has elapsed from the point of time different from the time when the excitation light is turned off to the time of detection or standard time; however, in that case, the expression is modified as appropriate.

Figure 14:
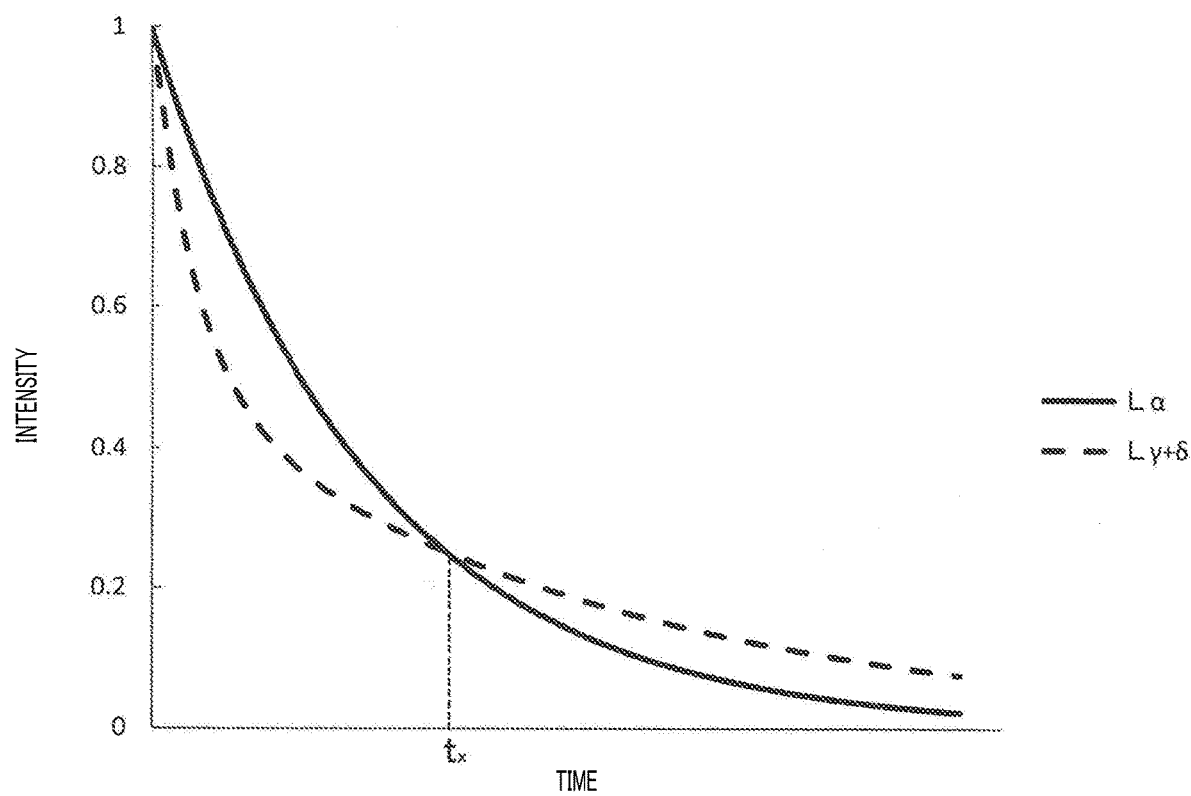
FIG. 14 is a graph showing the decay characteristics of the phosphorescence emitted from a phosphorescent material.

The intensity of phosphorescence emitted from the phosphorescent material α and the intensity of phosphorescence emitted from a mixture of the phosphorescent material γ and the phosphorescent material δ may be equal at a time $t_x$ as shown in FIG. 14 depending on the decay time constants of these phosphorescent materials. Even when the phosphorescence intensity is detected at the time $t_x$, whether the phosphorescent material contained in the detection target T is a single phosphorescent material α or a mixture of the phosphorescent material γ and the phosphorescent material δ having different decay time constants cannot be determined. For example, it is assumed that a true security mark includes a single phosphorescent material α and the authenticity of the security mark is determined by evaluating the phosphorescence intensity detected at the time $t_x$. In this case, when the false security mark contains a mixture of the phosphorescent material γ and the phosphorescent material δ, the authenticity of the security mark cannot be correctly determined. The same applies when the true security mark contains a mixture of the phosphorescent material γ and the phosphorescent material δ, and the false security mark contains a single phosphorescent material α.

However, the phosphorescence detection apparatus according to the present invention does not cause such a problem. The phosphorescence detection apparatus according to the present invention will now be described with reference to the accompanying drawings. As described above, when multiple types of phosphorescence having different decay time constants are emitted from a single phosphorescent material, they can be regarded as the same as the phosphorescence emitted from a mixture of the phosphorescent material γ and the phosphorescent material δ. The following description takes a mixture of a plurality of phosphorescent materials that have different decay time constants, as an example of phosphorescent material representing a single phosphorescent material that emits multiple types of phosphorescence having different decay time constants and a mixture of a plurality of phosphorescent materials that have different decay time constants.

In the present invention, whether the detected phosphorescence is phosphorescence emitted from a single phosphorescent material or phosphorescence emitted from a mixture of a plurality of phosphorescent materials is only an aspect of the invention. The present invention determines whether the detected phosphorescence results from phosphorescence that emits light within the same wavelength range and has a single decay time constant, or multiple types of phosphorescence that emit light within the same wavelength range and have different decay time constants.

(2) Structure of Phosphorescence Detection Apparatus

The structure of the phosphorescence detection apparatus 100 according to the present invention is as described above as the light detection apparatus 100.

The structure of the optical sensor 10 is as described above.

(3) Method of Detecting Phosphorescence

The detection of phosphorescence is performed as described above.

(4) Operation of Phosphorescence Detection Apparatus

Figure 10:
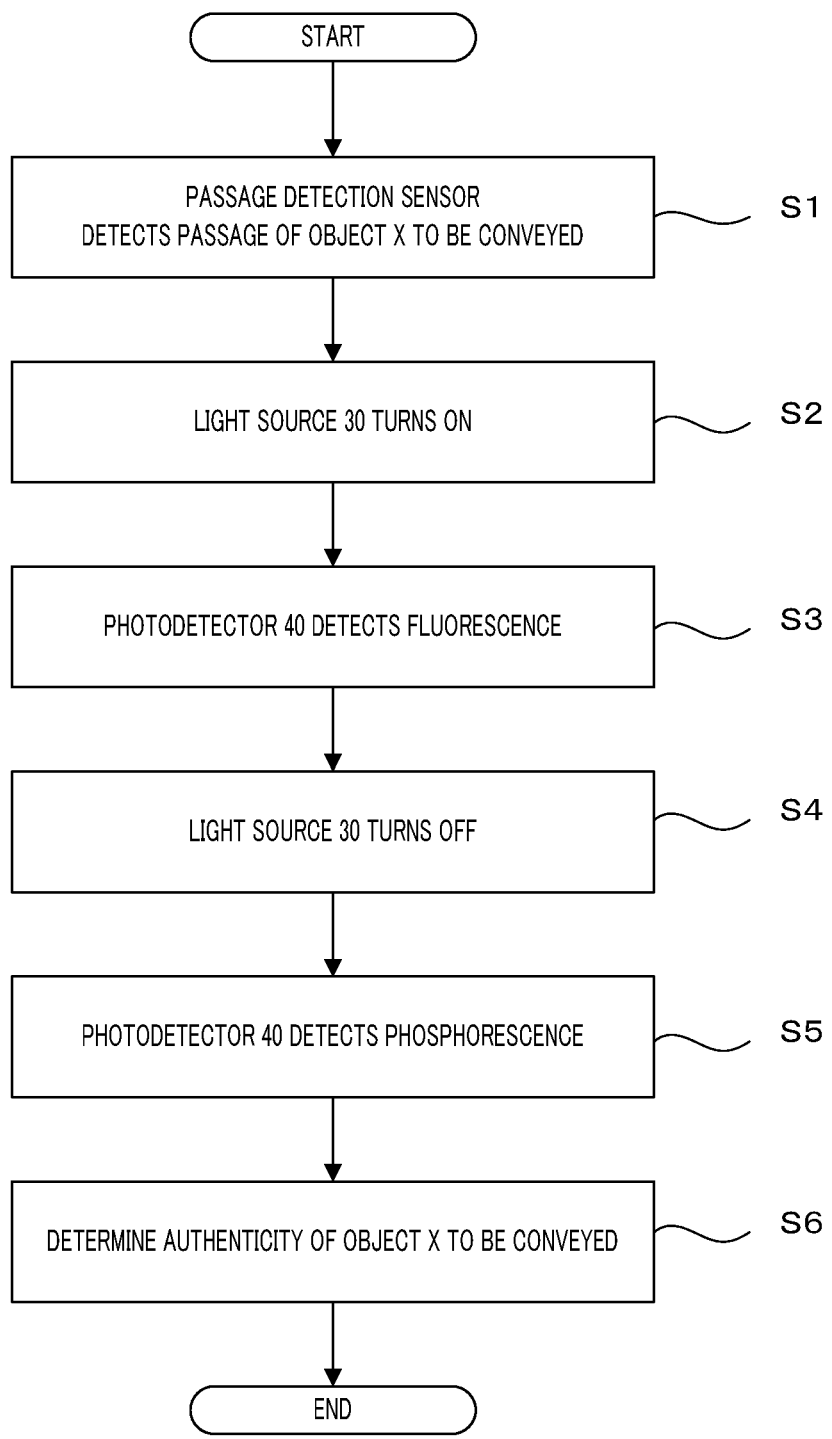
FIG. 10 is a flow chart showing the operation flow of a light detection apparatus according to the present invention.

The operation of the phosphorescence detection apparatus 100 is as described above as the operation of the light detection apparatus 100 with reference to FIG. 10.

(5) Method of Determining Phosphorescent Material

In Step S6 (FIG. 10), the phosphorescence detection apparatus 100 determines whether or not the phosphorescent material among the materials contained in the detection target T is a phosphorescent material that emits light within the same wavelength range and is composed of a plurality of types of dye having different decay time constants.

In other words, for all of at least three phosphorescence intensities detected in Step S5 and their detection timings, when there is no $A_\alpha$ and $\tau_\alpha$ in which the relationship between the phosphorescence intensity Pa and the time t represented by Expression 5 exists, the detected phosphorescence is determined to have been emitted from a plurality of types of phosphorescent material having different decay time constants. In contrast, for all of at least three phosphorescence intensities and their detection timings, if there are $A_\alpha$ and $\tau_\alpha$ in which the relationship between the phosphorescence intensity $P_\alpha$ and the time t represented by Expression 5 exists, the detected phosphorescence is determined to have been emitted from a single phosphorescent material.

A specific example of the determination method will be explained below.

Although the phosphorescence intensity is detected at least three times in Step S5, when the relative position of the detection target T with respect to the photodetector 40 is constant, there is no need to correct the detected phosphorescence intensity, and the determination method described below is performed using the detected phosphorescence intensity. On the other hand, when the relative position of the detection target T with respect to the photodetector 40 fluctuates or is likely to fluctuate, the detected phosphorescence intensity is corrected and the determination method described below using the corrected phosphorescence intensity is performed. Thus, the term intensity used in the following description encompasses both corrected and uncorrected intensities.

(5-1) Specific Example 1 of Determination Method

The determination method of this example utilizes the fact that the intensity of phosphorescence emitted from a single phosphorescent material α satisfies the relationship shown by the curve $L_\alpha$ in FIG. 14 regardless of the detection time.

To be specific, the detection unit 92 detects the intensity $P_1$, intensity $P_2$, and intensity $P_3$ of phosphorescence emitted from the detection target T when the time $t_1$, time $t_2$, and time $t_3$ have elapsed after the stop of emission of excitation light. The determination unit 94 calculates the decay time constant $\tau_1$ of the phosphorescent emitted from the detection target T based on the following Expression 8, using two of these three intensities, for example, the intensity $P_1$ and the intensity $P_2$, and the time $t_1$ and the time $t_2$ at which they were detected.

[Expression 8]

$$\tau_1 = -(t_2-t_1)/\ln(P_2/P_1) \quad (8)$$

The relationship between the phosphorescence intensity P represented by such a decay time constant $\tau_1$ and the time t that has elapsed from the time when the excitation light is turned off to the time of detection is represented by the following Expression 9.

[Expression 9]

$$P = A \exp(-t/\tau_1) \quad (9)$$

In Expression 9, A is a constant determined by the concentration and the emission efficiency of the phosphorescent material in the detection target T.

The constant A can be calculated by substituting the phosphorescence intensity that was used to obtain the decay time constant $\tau_1$ and its detection time (for example, $P_1$ and $t_1$) into Expression 9.

The determination unit 94 determines whether or not the intensity $P_3$ that was not used for the calculation of the decay time constant $\tau_1$ and its detection time $t_3$ satisfy the relationship represented by Expression 9, that is, whether or not the intensity P becomes the intensity $P_3$ when the time $t_3$ is substituted for the time t in Expression 9. When they satisfy it, the determination unit 94 determines that the detected phosphorescence is emitted from a single phosphorescent material or a plurality of phosphorescent materials having the same decay time constant.

In contrast, when the intensity $P_3$ that was not used for the calculation of the decay time constant τ1 and its detection time t3 does not satisfy the relationship represented by Expression 9, the determination unit 94 determines that the detected phosphorescence is emitted from a plurality of phosphorescent materials having different decay time constants.

Naturally, it is acceptable that phosphorescence intensity is detected four or more times, two of them are selected as appropriate to calculate the decay time constants, and whether or not one or more phosphorescence intensities, which were not used in the calculation of the decay time constants, and their detection times satisfy the relationship between the phosphorescence intensity and time represented by the decay time constant is determined.

(5-2) Specific Example 2 of Determination Method

The determination method of this example utilizes the fact that the phosphorescence intensities at any two points selected on the curve $L_\alpha$ shown in FIG. 14 and the decay time constants calculated based on their detection times are values specific to the phosphorescent material α.

In this embodiment, the detection unit 92 detects the intensity $P_4$, intensity $P_5$, intensity $P_6$, and intensity $P_7$ of phosphorescence emitted from the detection target T when the time $t_4$, time $t_5$, time $t_6$, and time $t_7$ have elapsed after the stop of emission of excitation light. Assuming that the first combination, which is a combination of two of these four intensities, is, for example, a combination of intensities $P_4$ and $P_5$, the determination unit 94 calculates the decay time constant $\tau_2$ of phosphorescence emitted from the detection target T based on the following Expression 10.

[Expression 10]

$$\tau_2 = -(t_5-t_4)/\ln(P_5/P_4) \quad (10)$$

Assuming that the second combination, which is a combination of two of these four intensities and is different from the first combination, is, for example, a combination of intensities $P_6$ and $P_7$, the determination unit 94 calculates the decay time constant $\tau_3$ of phosphorescence emitted from the detection target T based on the following Expression 11.

[Expression 11]

$$\tau_3 = -(t_7-t_6)/\ln(P_7/P_6) \quad (11)$$

The determination unit 94 compares the decay time constant $\tau_2$ with the decay time constant $\tau_3$. When the difference between them is less than or equal to a threshold, the determination unit 94 determines that the detected phosphorescence is emitted from a single phosphorescent material or a plurality of phosphorescent materials having the same decay time constant (this threshold may be 0).

When the difference between the decay time constant $\tau_2$ and the decay time constant $\tau_3$ exceeds a threshold, the determination unit 94 determines that the detected phosphorescence is emitted from multiple types of phosphorescent material having different decay time constants, respectively.

Needless to say, although the intensity of phosphorescence is detected four times to determine the phosphorescence in this example, the intensity of phosphorescence may be detected three times. For example, the phosphorescence can be determined according to the method of this embodiment also by setting the first combination to a combination of intensities $P_4$ and $P_5$ and setting the second combination to a combination of intensities $P_5$ and $P_6$ or a combination of intensities $P_4$ and $P_6$. It is optional to set the number of times of detection of phosphorescence intensity to five or more and select and use three or four of the detected phosphorescence intensities.

Here, it is assumed that the interval between the time $t_4$ and the time $t_5$ at which two phosphorescence intensities constituting the first combination are detected, and the interval between the time $t_6$ and the time $t_7$ at which two phosphorescence intensities constituting the second combination are detected are equal. In this case, as easily understood from Expressions 10 and 11, instead of comparison between the decay time constant $\tau_2$ and the decay time constant $\tau_3$, comparison between $\ln(P_5/P_4)$ and $\ln(P_7/P_6)$ or comparison between $(P_5/P_4)$ and $(P_7/P_6)$ is performed, thereby achieving determination of the detected phosphorescence. In this case, the number of divisions performed by the CPU of the control apparatus 90 to determine the phosphorescence can be reduced, so that the phosphorescence can be determined in a short time.

(5-3) Specific Example 3 of Determination Method

Figure 15:
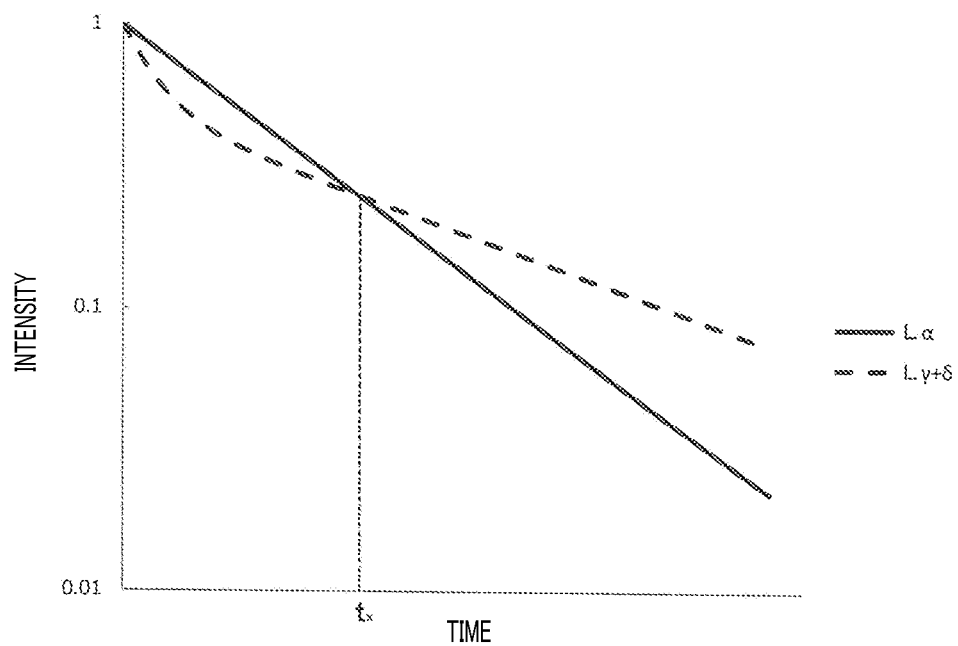
FIG. 15 is a semi-logarithmic graph changed from the graph shown in FIG. 14 so that the vertical axis is converted to a logarithmic value.

The determination method of this example utilizes the fact that, when the graph of FIG. 14 is converted to the semilogarithmic graph the vertical axis of which is the common logarithm shown in FIG. 15, the curve $L_\alpha$ is represented by a downward sloping line whereas the curve $L_{\gamma+\delta}$ is represented by a downward sloping curve that intersects $L_\alpha$ at the time $t_x$.

To be specific, the detection unit 92 detects the intensity $P_8$, intensity $P_9$, and intensity $P_{10}$ of phosphorescence emitted from the detection target T when the time $t_8$, time $t_9$, and time $t_{10}$ have elapsed. It is assumed that the first combination, which is a combination of two of these three intensities, is, for example, a combination of intensities $P_8$ and $P_9$. In this case, the determination unit 94 calculates the first change rate (first change amount per unit time) $R_1$ of the logarithmic value of the phosphorescence intensity on the basis of the following Expression 12.

[Expression 12]

$$R_1 = (\log P_9 - \log P_8)/(t_9 - t_8) \quad (12)$$

It is assumed that the second combination, which is a combination of two of these three intensities, is, for example, a combination of intensities $P_9$ and $P_{10}$. In this case, the determination unit 94 calculates the second change rate (second change amount per unit time) $R_2$ of the logarithmic value of the phosphorescence intensity on the basis of the following Expression 13. Note that the second combination is different from the first combination.

[Expression 13]

$$R_2 = (\log P_{10} - \log P_9)/(t_{10} - t_9) \quad (13)$$

The determination unit 94 compares the first change rate $R_1$ with the second change rate $R_2$. When the difference between them is less than or equal to a threshold, the determination unit 94 determines that the detected phosphorescence is emitted from a single phosphorescent material or a plurality of phosphorescent materials having the same decay time constant (this threshold may be 0).

When the difference between the first change rate $R_1$ and the second change rate $R_2$ exceeds a threshold, the determination unit 94 determines that the detected phosphorescence is emitted from multiple types of phosphorescent material having different decay time constants, respectively.

Here, it is assumed that the interval between the time $t_8$ and the time $t_9$ at which two phosphorescence intensities constituting the first combination are detected, and the interval between the time $t_9$ and the time $t_{10}$ at which two phosphorescence intensities constituting the second combination are detected are equal. In this case, as easily understood from Expressions 12 and 13, instead of comparison between the first change rate $R_1$ and the second change rate $R_2$, comparison between the difference between $\log P_9$ and $\log P_8$ and the difference between $\log P_{10}$ and $\log P_9$ is performed, thereby achieving determination of the detected phosphorescence. In this case, the number of divisions performed by the CPU of the control apparatus 90 to determine the phosphorescence can be reduced, so that the phosphorescence can be determined in a short time.

Needless to say, in this embodiment, the second combination may be a combination of $P_8$ and $P_{10}$. Alternatively, the phosphorescence intensity $P_{11}$ may be detected at time $t_{11}$, and the first combination may be a combination of $P_8$ and $P_9$ and the second combination may be a combination of $P_{10}$ and $P_{11}$. It is also optional to make the number of detections of phosphorescence five or more and appropriately select and use three or four of the detected phosphorescence intensities.

In addition, in the phosphorescence detection apparatus 100 with which phosphorescence can be determined by detecting the phosphorescence intensity three times at different detection times, the amount of data to be processed is small. In other words, the phosphorescence detection apparatus 100 can perform data processing and, consequently, determination of the phosphorescence in a short time. The phosphorescence detection apparatus 100 can therefore perform the authenticity recognition processing on a large amount of detection target T in a short time.

In addition, since the phosphorescence detection apparatus 100 detects phosphorescence intensity more than once with the single optical sensor 10, the time interval between phosphorescence detections can be made short. Therefore, even when the decay time constant of the phosphorescent material included in the detection target T is small (phosphorescence decays in a short time), the phosphorescence intensity before falling below the detection limit can be detected more than once. Consequently, even when the decay time constant of the phosphorescent material contained in the detection target T is small, the authenticity recognition processing can be performed on the detection target T.

In addition, since the light detection apparatus 100 detects phosphorescence intensity more than once with the single optical sensor 10, the phosphorescence detection timing can be set flexibly according to the decay time constant of the phosphorescence emitted from the phosphorescent material contained in the detection target T.

(6) Method of Determining Authenticity of Detection Target

The authenticity of the detection target T (security feature) attached to an object X to be conveyed is determined, for example, in the following manner.

First, whether or not phosphorescence is being emitted is checked for each photodetector 40. When phosphorescence is being emitted, its decay time constant is calculated. Further, whether or not the phosphorescence has been emitted from multiple types of phosphorescent material having different decay time constants is determined according to the method described above. These results are compared with reference attributes. When the comparison shows that the two match, the detection target T is determined to be true. When the two do not match, the detection target T is determined to be false.

Table 1 shows an example of reference attribute.

TABLE 1

| Decay time constant | Phosphorescent color | | |
|---|---|---|---|
| (msec) | Red | Green | Blue |
| 0.2 | None | none | single |
| 1 | Single | complex | none |
| 10 | None | none | none |

In Table 1, the horizontal axis represents the wavelength range of phosphorescence to be detected. In other words, the horizontal axis means that phosphorescence is divided by wavelength range into the red wavelength range, the green wavelength range, and the blue wavelength range. The vertical axis represents the decay characteristics of the detected phosphorescence. In other words, the vertical axis means that the decay time constant of the phosphorescence is divided into 0.2 msec, 1 msec, and 10 msec. "Single" means that the corresponding phosphorescence is emitted from a single phosphorescent material or multiple types of phosphorescent material having the same decay time constant. "Complex" means that the corresponding phosphorescence is emitted from multiple types of phosphorescent material having different decay time constants. "None" means that the phosphorescence is not detected.

When the reference attribute is the attribute shown in Table 1, the true detection target T contains a single or multiple types of phosphorescent material that have a decay time constant of 0.2 msec and emit blue phosphorescence. It also contains a single or multiple types of phosphorescent material that have a decay time constant of 1 msec and emit red phosphorescence. It also contains multiple types of phosphorescent material that emit phosphorescence that have different decay time constants and are all green in color, and their decay time constants calculated based on the total intensity of green phosphorescence detected at a predetermined timing is 1 msec.

In this case, the authenticity of the detection target T is determined in the following manner. First, the detection unit 92 detects red, green, and blue phosphorescence separately via three photodetectors 40. Subsequently, the determination unit 94 calculates the decay time constant of phosphorescence of each color. The determination unit 94 also determines whether or not the phosphorescence of each color has been emitted from multiple types of phosphorescent material having different decay time constants (whether it is "complex" or "single"). The determination unit 94 refers to information on Table 1 stored in the storage unit 95, and compares it with the decay time constant of phosphorescence determined for each color and the determination result. When the result shows that the attribute of the phosphorescence that has been emitted from a certain detection target T matches the attribute shown in Table 1, the detection target T is determined to be true. In contrast, when it does not match the attribute of the phosphorescence shown in Table 1, the detection target T is determined to be false.

In the case where phosphorescence is emitted from multiple types of phosphorescent material having different decay time constants, the decay time constant of the total intensity of phosphorescence emitted from that phosphorescent material is merely a clue to determine it corresponds to any of the decay time constants contained in the reference attributes. Therefore, it is sufficient to calculate an approximate value which is determined, for example, in the following manner. In other words, a first temporary decay time constant is calculated based on any two combinations of the three or more intensities detected within the detectable wavelength range for each detection unit 92, and their detection times. Next, a second temporary decay time constant is calculated based on a combination of two or more of the detected three or more intensities, which is different from the aforementioned combination, and their detection times. Subsequently, the average value of the first temporary decay time constant and the second temporary decay time constant is determined, and is regarded the decay time constant of all intensities. Alternatively, the first temporary decay time constant as it is may be regarded the decay time constant of all intensities.

As described above, the authenticity of the detection target T (security feature) and consequently the authenticity of an object X to be conveyed, such as a sheet, can be determined using a feature that is whether the phosphorescence has been emitted from multiple types of phosphorescent material having different decay time constants.

Although an example case in which only a feature of phosphorescence is used as the feature of the detection target T is shown here, a feature of the detected fluorescence may be added to the feature of the detection target T. To be specific, in Table 1, whether or not fluorescence has been detected can be added as a feature for each of the red wavelength range, the green wavelength range, and the blue wavelength range.

The phosphorescence detection apparatus and the phosphorescence detection method of the present invention, which detect a phosphorescent material attached as a security feature on the surface of a sheet, represented by value documents such as banknotes or securities, irradiate a phosphorescent material to be a detection target with excitation light to detect the phosphorescence emitted from the phosphorescent material. Since features, such as the spectrum and decay characteristics of phosphorescence, are determined by the composition of the phosphorescent material, the authenticity of the security feature can be determined by detecting phosphorescence and comparing their features.

Although the embodiments of the present invention have been described so far, the present invention is not limited to the aforementioned embodiments and various modifications can be made without departing from the scope of the present invention.

For example, the phosphorescence detection apparatus 100 includes three or more optical sensors 10 spaced apart in the conveyance direction on the conveyance path of the object X to be conveyed, and each optical sensor 10 may detect phosphorescence intensity once so that phosphorescence intensity may be detected a total of three or more times. The above determination can be performed using each of the intensities P obtained by three or more times of detection and their detection times $t_n$. In this case, phosphorescence the intensity of which has significantly decreased can be detected with the optical sensor 10 located downstream even when the decay time constant of the phosphorescent material contained in the detection target T is large (a long time is needed for phosphorescence to decay) and the conveyance speed of the conveyor apparatus 80 is high. Accordingly, even when the decay time constant of the phosphorescent material contained in the detection target T is large, authenticity discrimination processing can be performed for a large amount of detection target T during the conveyance of the object X to be conveyed.

The second embodiment is summarized as follows.

[1]

A phosphorescence detection apparatus including:

a light source that irradiates a detection target with the excitation light, the detection target containing a phosphorescent material;

a photodetector that detects the intensity of phosphorescence emitted from the detection target, and a detection unit that controls the light source and the photodetector, and detects the intensity at least three times after the stop of the irradiation with the excitation light, changing the detection time; and a determination unit that determines whether or not the phosphorescence results from multiple types of phosphorescence having different decay time constants, on the basis of the at least three intensities detected by the detection unit and their detection times.

[2]

The phosphorescence detection apparatus according to [1], in which the determination unit calculates the decay time constant of the phosphorescence on the basis of two of the at least three intensities, and when the intensity, which was not used in the calculation, and its detection time do not satisfy the relationship between the phosphorescence intensity and detection time represented by the calculated decay time constant, determines that the phosphorescence result from multiple types of phosphorescence having different decay time constants.

[3]

The phosphorescence detection apparatus according to [1], in which the determination unit calculates a first decay time constant of the phosphorescence on the basis of a first combination that is a combination of two of the at least three intensities, and calculates a second decay time constant of the phosphorescence on the basis of a second combination that is a combination of two of the at least three intensities and is different from the first combination, and when the difference between the first decay time constant and the second decay time constant exceeds a threshold, determines that the phosphorescence result from multiple types of phosphorescence having different decay time constants.

[4]

The phosphorescence detection apparatus according to [1], in which the determination unit calculates a first change rate of the logarithmic value of the intensity on the basis of a first combination that is a combination of two of the at least three intensities, and calculates a second change rate of the logarithmic value of the intensity on the basis of a second combination that is a combination of two of the at least three intensities and is different from the first combination, and when the difference between the first change rate and the second change rate exceeds a threshold, determines that the phosphorescence result from multiple types of phosphorescence having different decay time constants.

[5] The phosphorescence detection apparatus according to any one of [1] to [4], in which the determination unit determines the authenticity of the detection target by using a feature that is whether or not the phosphorescence results from multiple types of phosphorescence having different decay time constants.

[6]

A sheet processing apparatus comprising the phosphorescence detection apparatus according to any one of [1] to [5].

[7]

A phosphorescence detection method including:

irradiating a detection target with excitation light, the detection target containing a phosphorescent material;

detecting the intensity of phosphorescence emitted from the detection target at least three times after the stop of the irradiation with the excitation light, changing the detection time; and determining whether or not the phosphorescence results from multiple types of phosphorescence having different decay time constants, on the basis of at least three detected intensities and their detection times.

Third Embodiment (1) Structure of Phosphorescence Detection Apparatus

In FIG. 1, the structure of the phosphorescence detection apparatus 100 according to the present invention is as described above as the light detection apparatus 100.

The structure of the optical sensor 10 is as described above.

(2) Phosphorescence Detection Method

Detection of phosphorescence is performed as described above.

(3) Operation of Phosphorescence Detection Apparatus

The operation of the phosphorescence detection apparatus 100 is as described above as the operation of the light detection apparatus 100 with reference to FIG. 10.

(4) Method of Determining Phosphorescence

The phosphorescence detection apparatus 100 calculates the decay time constant of phosphorescence for each photodetector 40 (for each color of radiation light) in Step S6 (FIG. 10), and determines phosphorescence emitted from the phosphorescent material contained in the detection target T.

To be specific, when phosphorescence is detected in Step S5, the determination unit 94 uses the intensity $P_1$ and intensity $P_2$ of phosphorescence emitted from the detection target T at the time $t_1$ and time $t_2$ calculate the decay time constant $\tau_\alpha$ of the phosphorescent emitted from the detection target T according to Expression 2 for each photodetector 40. It then compares the decay time constant of phosphorescence to be recognized with the calculated decay time constant $\tau_\alpha$, thereby determining whether or not the phosphorescence to be recognized has been detected.

When three types of phosphorescence are to be recognized and their decay time constants are 0.2 msec, 1 msec, and 10 msec, respectively, the determination unit 94 compares three predetermined ranges including 0.2 msec, 1 msec, and 10 msec, respectively with the calculated decay time constant $\tau_\alpha$. When the result shows, for example, that the decay time constant $\tau_\alpha$ is within a predetermined range including 1 msec, the determination unit 94 determines that phosphorescence having a decay time constant of 1 msec has been detected.

(5) Method of Determining Authenticity of Detection Target

The authenticity of the detection target T (security feature) attached to an object X to be conveyed is determined, for example, in the following manner.

First, whether or not phosphorescence is being emitted is checked for each photodetector 40. When phosphorescence is being emitted, its decay time constant is calculated. These results are compared with reference attributes. When the comparison shows that the two match, the detection target T is determined to be true. When the two do not match, the detection target T is determined to be false.

Table 2 shows an example of reference attributes.

TABLE 2

| Decay time constant | Phosphorescent color | | |
|---|---|---|---|
| (msec) | Red | Green | Blue |
| 0.2 | Absent | Absent | Present |
| 1 | Present | Present | Absent |
| 10 | Absent | Absent | Absent |

In Table 2, the horizontal axis represents the wavelength range of phosphorescence to be detected. In other words, the horizontal axis means that phosphorescence is divided by wavelength range into the red wavelength range, the green wavelength range, and the blue wavelength range. The vertical axis represents the decay characteristics of the detected phosphorescence. In other words, the vertical axis means that the decay time constant of the phosphorescence is divided into 0.2 msec, 1 msec, and 10 msec. "Present" means that the corresponding phosphorescence is emitted from a single phosphorescent material or multiple types of phosphorescent material having the same decay time constant. "Absent" means that the phosphorescence is not detected.

When the reference attributes are the attributes shown in Table 2, the true detection target T contains a single or multiple types of phosphorescent material that emit phosphorescence that has a decay time constant of 0.2 msec and is blue in color. It also contains a single or multiple types of phosphorescent material that emit phosphorescence that has a decay time constant of 1 msec and is red in color. It also contains a single or multiple types of phosphorescent material that emit phosphorescence that has a decay time constant of 1 msec and is green in color.

In this case, the authenticity of the detection target T is determined in the following manner. First, the detection unit 92 detects red, green, and blue phosphorescence separately via three photodetectors 40. Subsequently, the determination unit 94 calculates the decay time constant of phosphorescence of each color. The determination unit 94 refers to information on Table 2 stored in the storage unit 95, and compares it with the decay time constant of phosphorescence determined for each color. When the result shows that the attributes of the phosphorescence that have been emitted from a certain detection target T match the attributes shown in Table 2, the detection target T is determined to be true. In contrast, when it does not match the attributes of the phosphorescence shown in Table 2, the detection target T is determined to be false.

As described above, the authenticity of the detection target T (security feature) and consequently the authenticity of an object X to be conveyed, such as a sheet, can be determined using a feature that is the presence or absence of phosphorescence and the decay time constant.

Although an example case in which only a feature of phosphorescence is used as the feature of the detection target T is shown here, a feature of the detected fluorescence may be added to the feature of the detection target T. To be specific, in Table 2, whether or not fluorescence has been detected can be added as a feature for each of the red wavelength range, the green wavelength range, and the blue wavelength range.

(6) Decay Time Constant of Phosphorescence to be Recognized

In order to recognize a large amount of detection target T in a short time, the phosphorescence to be recognized should be phosphorescence that decays in a certain short time. When the phosphorescence decay is too fast, the phosphorescence decays in a very short time, making it difficult to accurately detect the phosphorescence intensity. For this reason, phosphorescence to be recognized is preferably phosphorescence having a decay time constant of 0.2 msec or more and 10 msec or less.

In addition, in order to recognize which of the phosphorescence to be recognized corresponds to the detected phosphorescence, it is necessary that the decay time constants of phosphorescence to be recognized (that is, the decay curves of phosphorescence) be discrete to some extent.

Figure 16:
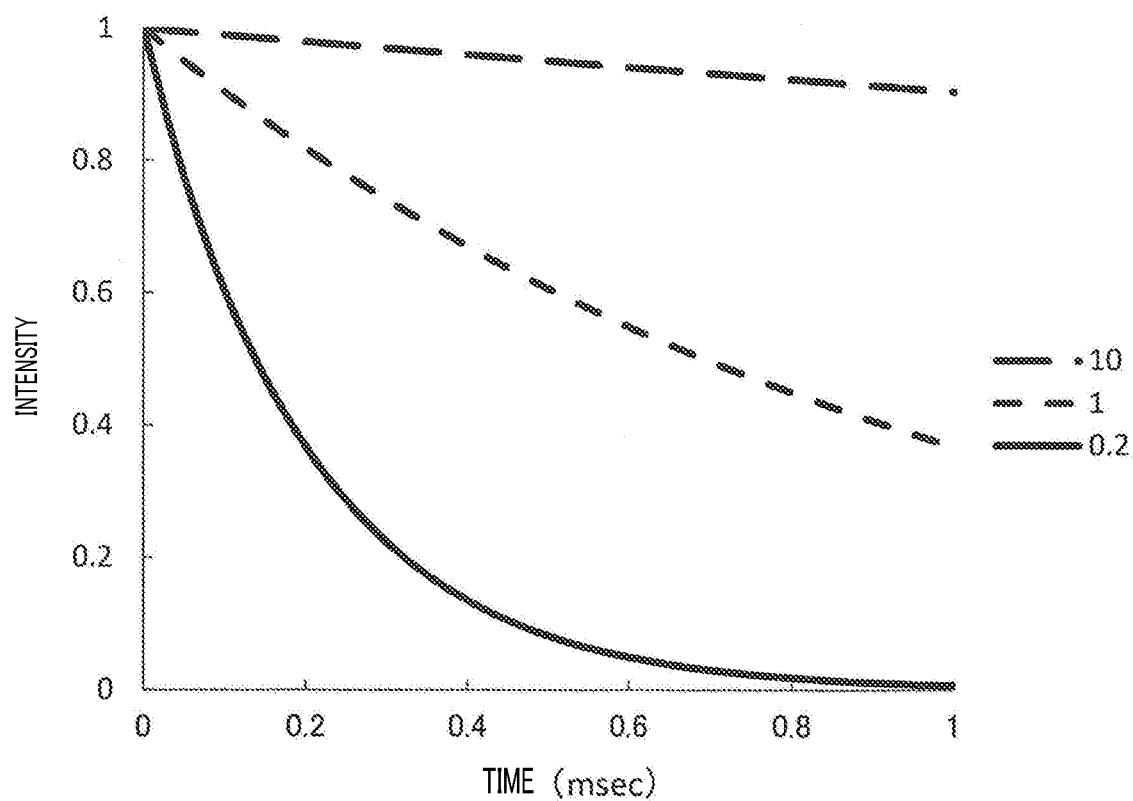
FIG. 16 is a graph showing decay curves showing the intensity ratios of three types of phosphorescence having different decay time constants.

Suppose, for example, that whether the phosphorescence emitted by the detection target T corresponds to any of the three types of phosphorescence is recognized. FIG. 16 shows the decay curves of the phosphorescence intensity ratio obtained with decay time constants of 0.2 msec, 1 msec, and 10 msec, respectively. In FIG. 16, the vertical axis represents the ratio of phosphorescence intensity to the maximum intensity (that is, the phosphorescence intensity detected in the first detection), and the horizontal axis represents the time elapsed from the first detection of phosphorescence intensity. As is clear from FIG. 16, these three decay curves are almost equally discrete. Thus, in the case where it is necessary to recognize which of the three types of phosphorescence corresponds to the phosphorescence emitted by the detection target T, for example, three types of phosphorescent material that emit phosphorescence having decay time constants of 0.2 msec, 1 msec, and 10 msec, respectively may be used as phosphorescent materials for the detection target T.

Figure 17:
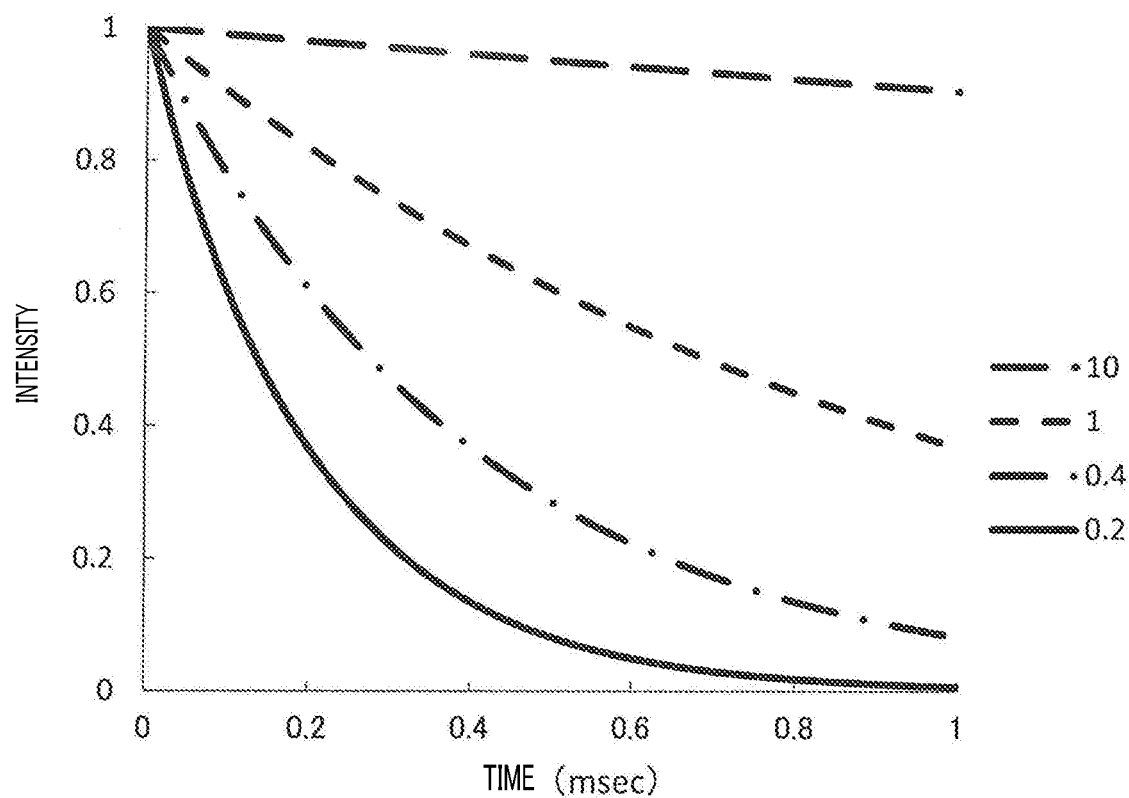
FIG. 17 is a graph showing decay curves showing the intensity ratios of four types of phosphorescence having different decay time constants.

Next, suppose that whether the phosphorescence emitted by the detection target T corresponds to any of the four types of phosphorescence is recognized. FIG. 17 shows the decay curves of the phosphorescence intensity ratio obtained with decay time constants of 0.2 msec, 0.4 msec, 1 msec, and 10 msec, respectively. In FIG. 17, the vertical axis represents the ratio of phosphorescence intensity to the maximum intensity (that is, the phosphorescence intensity detected in the first detection), and the horizontal axis represents the time elapsed from the first detection of phosphorescence intensity. As is clear from FIG. 17, these four decay curves are almost equally discrete. Thus, in the case where it is necessary to recognize which of the four types of phosphorescence corresponds to the phosphorescence emitted by the detection target T, for example, four types of phosphorescent material that emit phosphorescence having decay time constants of 0.2 msec, 0.4 msec, 1 msec, and 10 msec, respectively may be used as phosphorescent materials for the detection target T.

Figure 18:
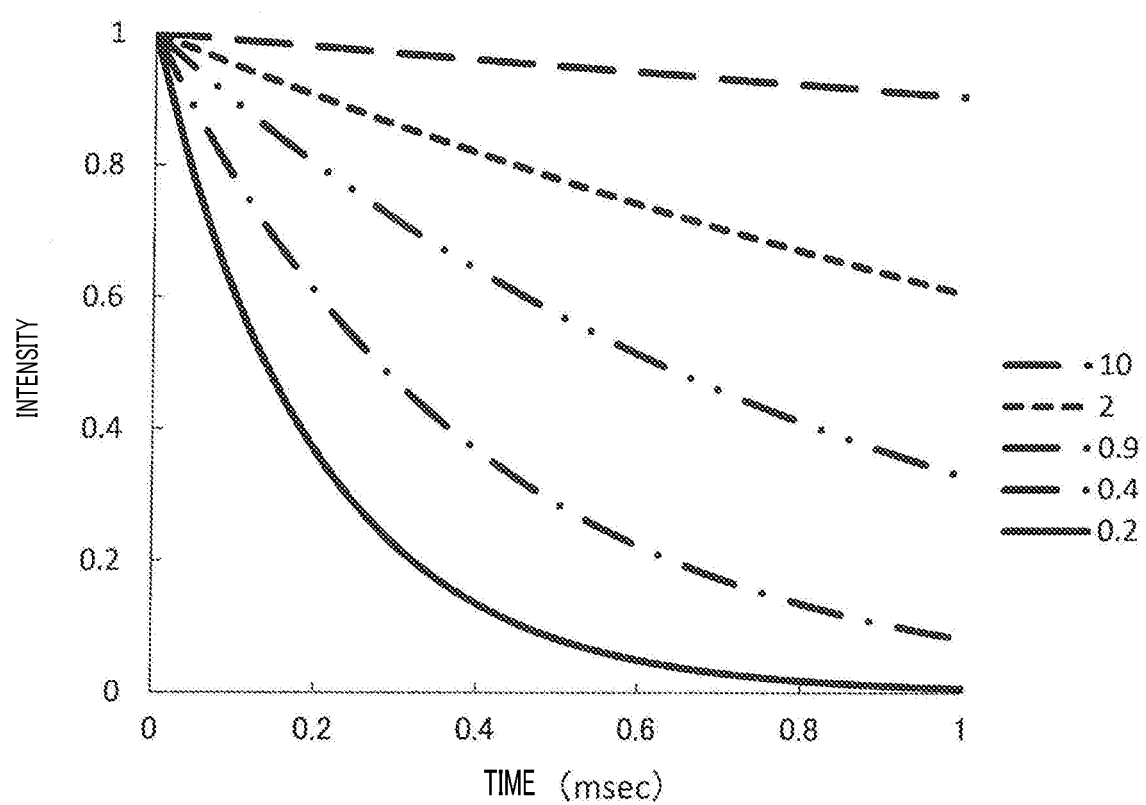
FIG. 18 is a graph showing decay curves showing the intensity ratios of five types of phosphorescence having different decay time constants.

Next, suppose that whether the phosphorescence emitted by the detection target T corresponds to any of the five types of phosphorescence is recognized. FIG. 18 shows the decay curves of the phosphorescence intensity ratio obtained with decay time constants of 0.2 msec, 0.4 msec, 0.9 msec, 2 msec, and 10 msec, respectively. In FIG. 18, the vertical axis represents the ratio of phosphorescence intensity to the maximum intensity (that is, the phosphorescence intensity detected in the first detection), and the horizontal axis represents the time elapsed from the first detection of phosphorescence intensity. As is clear from FIG. 18, these five decay curves are almost equally discrete. Thus, in the case where it is necessary to recognize which of the five types of phosphorescence corresponds to the phosphorescence material emitted by the detection target T, for example, five types of phosphorescent material that emit phosphorescence having decay time constants of 0.2 msec, 0.4 msec, 0.9 msec, 2 msec, and 10 msec, respectively may be used as phosphorescent materials for the detection target T.

(7) Timing of First Detection

When the intensity of reception light greatly changes at the moment when the irradiation with excitation light is stopped, the photodetector 40 may unintentionally output an abnormal signal depending on its own circuit system including a photodiode and an amplifier. To be specific, when the response speed of the photodetector 40 is slow, the photodetector 40 outputs a photodetection signal generated from the excitation light for a while even after the irradiation with the excitation light from the light source 30 is stopped. In that case, the intensity of the phosphorescence emitted from the detection target T cannot be detected correctly for a while. In contrast, when a phosphorescence intensity is detected after a sufficiently long time after the irradiation with the excitation light from the light source 30 is stopped, the influence of the abnormal signal at the moment when the irradiation with the excitation light is stopped disappears, although a long time is required for the recognition of the phosphorescence and, in the first place, the phosphorescence may decay and be not able to be detected. For this reason, the present inventors studied at which timing it is preferable to perform the first detection of a phosphorescence intensity (how to determine the first timing) after stopping the irradiation with the excitation light from the light source 30.

The circuit constituting the photodetector 40 includes a portion equivalent to a CR circuit. Therefore, the response speed of the photodetector 40 depends on the time constant $\tau_{CR}$ of the CR circuit. In other words, after the irradiation with the excitation light is stopped, the photodetector 40 outputs a voltage that decays with the time constant $\tau_{CR}$ as a photodetection signal generated from the excitation light. At the time when the first detection of the phosphorescence intensity is performed, when the voltage output according to the excitation light is within 1% or less of the voltage observed when the irradiation with the excitation light is stopped, it is considered that there is no influence of the excitation light.

For example, assuming that the capacitance of the capacitor C in the circuit of the photodetector 40 is 1 to 80 pF, which is usually selected, and the resistance of the resistor R in the circuit of the photodetector 40 is 100 to 500 kΩ, which is usually selected, the constant $\tau_{CR}$ is 0.0001 to 0.04 msec. This is because, for example, assuming that the capacitance of the capacitor C is 80 pF and the resistance of the resistor R is 500 kΩ, the voltage output from the photodetector 40 becomes 1/e, that is, drops to about 36% after 0.04 msec has elapsed from the time when the irradiation with the excitation light was stopped. In order for the voltage output from the photodetector 40 to be 1% or less of the output voltage observed during the irradiation with the excitation light, the time 4.6 times the time constant $\tau_{CR}$ is required. In other words, a time of 0.0046 to 0.184 msec is required.

Therefore, assuming that the timing (first timing) of the first detection of the phosphorescence intensity is a time 0.005 msec or more and 0.18 msec or less after the stop of the irradiation with the excitation light from the light source 30, phosphorescence intensity can be detected with almost no influence of the excitation light.

Desirable values of the capacitance of the capacitor C and the resistance of the resistor R in the circuit of the photodetector 40 are, for example, 15 pF and 500 kΩ, respectively. The time constant $\tau_{CR}$ in this case is 0.0075 msec, and the time 4.6 times that is 0.0345 msec. Therefore, the preferable first detection timing in this case is a time 0.035 msec or more after the stop of the irradiation with the excitation light. However, in consideration of variations in the capacitance of the capacitor C and the resistance of the resistor R, variations in the response characteristics of the light source 30, and variations in the position of the detection target T, it is necessary to anticipate a certain safety factor. For this reason, in anticipation of a safety factor of about 50%, it is preferable to perform the first detection 0.05 msec or more after the stop of the irradiation with the excitation light. However, after the lapse of an excessively long time, a long time is required to identify the phosphorescence, and in the first place, the phosphorescence may decay and be not able to be detected. Therefore, it is preferable to perform the first detection after the lapse of 0.1 msec or less which is twice 0.05 msec or after the laps of 0.15 msec or less which is three times 0.05 msec.

Further, the capacitance of the capacitor C and the resistance of the resistor R in the circuit of the photodetector 40 are not limited to the above ranges; the resistance of the resistor R may be 1 mΩ, for example. When the resistance is increased, the time constant $\tau_{CR}$ is also increased. Therefore, it is preferable to adjust the capacity of the capacitor C to keep the time constant $\tau_{CR}$ within the aforementioned range.

(8) Timing of Subsequent Detection

When a phosphorescence intensity is detected by the photodetector 40, the positions of the object X to be conveyed on the conveyor apparatus 80 and the detection target T attached to the object X to be conveyed vary to some extent in the vertical direction. When the position of the detection target T varies in the vertical direction, the distance between the detection target T and the photodetector 40 also varies, and the intensity of the detected phosphorescence necessarily varies. Although it is not impossible to detect the position in the vertical direction of the detection target T and correct it with the correction unit 93, in this case, the speed of the recognition processing performed on the detection target T may significantly decrease. It is therefore necessary to determine the timing (second timing) of the subsequent detection of a phosphorescence intensity in advance, anticipating the occurrence of such variations.

After trial and error, the present inventors found that when a phosphorescence intensity is detected at the time when the difference between the intensity ratio of phosphorescence emitted from one phosphorescent material to be recognized and the intensity ratio of phosphorescence emitted from another phosphorescent material to be recognized is 0.15 or more, which of the phosphorescent materials to be recognized the detected phosphorescence has been emitted from can be recognized with reliability. Here, the intensity ratio is the ratio $P_2/P_1$ which is the ratio of the phosphorescence intensity $P_2$ detected in the subsequent detection performed in the second timing to the phosphorescence intensity $P_1$ detected in the first detection performed at the first timing.

The present inventors also found that when a phosphorescence intensity is detected at the time when the difference between the intensity ratio of phosphorescence emitted from one phosphorescent material to be recognized and the intensity ratio of phosphorescence emitted from another phosphorescent material to be recognized is 0.2 or more, which of the phosphorescent materials to be recognized the detected phosphorescence has been emitted from can be recognized with more reliability.

(8-1) Recognition of Three Types of Phosphorescent Material

Table 3 shows the values on the three decay curves shown in FIG. 16.

TABLE 3

| Time elapsed from first detection (msec) | Intensity ratio | | |
|---|---|---|---|
| | Decay time constant(msec): 0.2 | Decay time constant(msec): 1 | Decay time constant(msec): 10 |
| 0.00 | 1.00 | 1.00 | 1.00 |
| 0.05 | 0.78 | 0.95 | 1.00 |
| 0.10 | 0.61 | 0.90 | 0.99 |
| 0.15 | 0.47 | 0.86 | 0.99 |
| 0.20 | 0.37 | 0.82 | 0.98 |
| 0.25 | 0.29 | 0.78 | 0.98 |
| 0.30 | 0.22 | 0.74 | 0.97 |
| 0.35 | 0.17 | 0.70 | 0.97 |
| 0.40 | 0.14 | 0.67 | 0.96 |
| 0.45 | 0.11 | 0.64 | 0.96 |
| 0.50 | 0.08 | 0.61 | 0.95 |
| 0.55 | 0.06 | 0.58 | 0.95 |
| 0.60 | 0.05 | 0.55 | 0.94 |
| 0.65 | 0.04 | 0.52 | 0.94 |
| 0.70 | 0.03 | 0.50 | 0.93 |
| 0.75 | 0.02 | 0.47 | 0.93 |
| 0.80 | 0.02 | 0.45 | 0.92 |
| 0.85 | 0.01 | 0.43 | 0.92 |
| 0.90 | 0.01 | 0.41 | 0.91 |
| 0.95 | 0.01 | 0.39 | 0.91 |
| 1.00 | 0.01 | 0.37 | 0.90 |

As shown in Table 3, 0.05 msec or more after the first detection of the phosphorescence intensity, the difference between the phosphorescence intensity ratio with a decay time constant of 0.2 msec and the phosphorescence intensity ratio with a decay time constant of 1 msec is 0.15 or more. Therefore, when the subsequent detection of a phosphorescence intensity is performed 0.05 msec or more after the first detection of a phosphorescence intensity, whether the decay time constant of the detected phosphorescence is either 0.2 msec or 1 msec can be recognized with reliability.

Note that 0.50 msec or more after the first detection of a phosphorescence intensity, the phosphorescence intensity ratio with a decay time constant of 0.2 msec falls below 0.1. In that case, the phosphorescence is weak, which may make it difficult to detect the phosphorescence with the photodetector 40. Therefore, in order to recognize whether the decay time constant of the detected phosphorescence is either 0.2 msec or 1 msec, the subsequent detection is preferably performed before the lapse of 0.50 msec from the end of the first detection of a phosphorescence intensity.

As shown in Table 3, 0.20 msec or more after the first detection of the phosphorescence intensity, the difference between the phosphorescence intensity ratio with a decay time constant of 1 msec and the phosphorescence intensity ratio with a decay time constant of 10 msec is 0.15 or more. Therefore, when the subsequent detection of a phosphorescence intensity is performed 0.20 msec or more after the first detection of a phosphorescence intensity, whether the time constant of the detected phosphorescence is 1 msec or 10 msec can be recognized with reliability. However, when the subsequent detection of a phosphorescence intensity is performed a long time after the end of the first detection of the phosphorescence intensity, a large amount of detection target T cannot be recognized in a short time. For this reason, the subsequent detection is preferably performed within 1 msec after the first detection.

As shown in Table 3, a certain time, which is in the range of 0.20 msec to 0.45 msec, after the first detection of the phosphorescence intensity, the difference between the phosphorescence intensity ratio with a decay time constant of 0.2 msec and the phosphorescence intensity ratio with a decay time constant of 1 msec is greater than 0.15. At the same time, the difference between the phosphorescence intensity ratio with a decay time constant of 1 msec and the phosphorescence intensity ratio with a decay time constant of 10 msec is also greater than 0.15. Therefore, when the subsequent detection of a phosphorescence intensity is performed a certain time, which is in the range of 0.20 msec to 0.45 msec, after the first detection of a phosphorescence intensity, whether the decay time constant of the detected phosphorescence is either 0.2 msec, 1 msec, or 10 msec can be recognized with reliability.

As shown in Table 3, 0.10 msec or more after the first detection of the phosphorescence intensity, the difference between the phosphorescence intensity ratio with a decay time constant of 0.2 msec and the phosphorescence intensity ratio with a decay time constant of 1 msec is 0.2 or more. Therefore, when the subsequent detection of a phosphorescence intensity is performed 0.10 msec or more after the first detection of a phosphorescence intensity, whether the decay time constant of the detected phosphorescence is either 0.2 msec or 1 msec can be recognized with more reliability.

As shown in Table 3, a certain time, which is in the range of 0.25 msec to 0.45 msec, after the first detection of the phosphorescence intensity, the difference between the phosphorescence intensity ratio with a decay time constant of 0.2 msec and the phosphorescence intensity ratio with a decay time constant of 1 msec is greater than 0.2. At the same time, the difference between the phosphorescence intensity ratio with a decay time constant of 1 msec and the phosphorescence intensity ratio with a decay time constant of 10 is also greater than 0.2. Therefore, when the subsequent detection of a phosphorescence intensity is performed a certain time, which is in the range of 0.25 msec to 0.45 msec, after the first detection of a phosphorescence intensity, whether the time constant of the detected phosphorescence is either 0.2 msec, 1 msec, or 10 msec can be recognized with more reliability.

(8-2) Recognition of Four Types of Phosphorescent Material

Table 4 shows the values on the four decay curves shown in FIG. 17.

TABLE 4

| Time elapsed from first detection (msec) | Intensity ratio | | | |
|---|---|---|---|---|
| | Decay time constant(msec): 0.2 | Decay time constant(msec): 0.4 | Decay time constant(msec): 1 | Decay time constant(msec): 10 |
| 0.00 | 1.00 | 1.00 | 1.00 | 1.00 |
| 0.05 | 0.78 | 0.88 | 0.95 | 1.00 |
| 0.10 | 0.61 | 0.78 | 0.90 | 0.99 |
| 0.15 | 0.47 | 0.69 | 0.86 | 0.99 |
| 0.20 | 0.37 | 0.61 | 0.82 | 0.98 |
| 0.25 | 0.29 | 0.54 | 0.78 | 0.98 |
| 0.30 | 0.22 | 0.47 | 0.74 | 0.97 |
| 0.35 | 0.17 | 0.42 | 0.70 | 0.97 |
| 0.40 | 0.14 | 0.37 | 0.67 | 0.96 |
| 0.45 | 0.11 | 0.32 | 0.64 | 0.96 |
| 0.50 | 0.08 | 0.29 | 0.61 | 0.95 |
| 0.55 | 0.06 | 0.25 | 0.58 | 0.95 |
| 0.60 | 0.05 | 0.22 | 0.55 | 0.94 |
| 0.65 | 0.04 | 0.20 | 0.52 | 0.94 |
| 0.70 | 0.03 | 0.17 | 0.50 | 0.93 |
| 0.75 | 0.02 | 0.15 | 0.47 | 0.93 |
| 0.80 | 0.02 | 0.14 | 0.45 | 0.92 |
| 0.85 | 0.01 | 0.12 | 0.43 | 0.92 |
| 0.90 | 0.01 | 0.11 | 0.41 | 0.91 |
| 0.95 | 0.01 | 0.09 | 0.39 | 0.91 |
| 1.00 | 0.01 | 0.08 | 0.37 | 0.90 |

As shown in Table 4, a certain time, which is in the range of 0.20 msec to 0.45 msec, after the first detection of the phosphorescence intensity, the difference between the phosphorescence intensity ratio with a decay time constant of 0.2 msec and the phosphorescence intensity ratio with a decay time constant of 0.4 msec is greater than 0.15. At the same time, the difference between the phosphorescence intensity ratio with a decay time constant of 0.4 msec and the phosphorescence intensity ratio with a decay time constant of 1 msec is also greater than 0.15. Further, at this time, the difference between the phosphorescence intensity ratio with a decay time constant of 1 msec and the phosphorescence intensity ratio with a decay time constant of 10 msec is also greater than 0.15. Therefore, when the subsequent detection of a phosphorescence intensity is performed a certain time, which is in the range of 0.20 msec to 0.45 msec, after the first detection of a phosphorescence intensity, whether the time constant of the detected phosphorescence is either 0.2 msec, 0.4 msec, 1 msec, or 10 msec can be recognized with reliability.

As shown in Table 4, a certain time, which is in the range of 0.30 msec to 0.45 msec, after the first detection of the phosphorescence intensity, the difference between the phosphorescence intensity ratio with a decay time constant of 0.2 msec and the phosphorescence intensity ratio with a decay time constant of 0.4 msec is greater than 0.2. At the same time, the difference between the phosphorescence intensity ratio with a decay time constant of 0.4 msec and the phosphorescence intensity ratio with a decay time constant of 1 msec is also greater than 0.2. Further, at this time, the difference between the phosphorescence intensity ratio with a decay time constant of 1 msec and the phosphorescence intensity ratio with a decay time constant of 10 msec is also greater than 0.2. Therefore, when the subsequent detection of a phosphorescence intensity is performed a certain time, which is in the range of 0.30 msec to 0.45 msec, after the first detection of a phosphorescence intensity, whether the time constant of the detected phosphorescence is either 0.2 msec, 0.4 msec, 1 msec, or 10 msec can be recognized with more reliability.

(8-3) Recognition of Five Types of Phosphorescent Material

Table 5 shows the values on the five decay curves shown in FIG. 18.

TABLE 5

| Time elapsed from first detection (msec) | Intensity ratio | | | | |
|---|---|---|---|---|---|
| | Decay time constant(msec): 0.2 | Decay time constant(msec): 0.4 | Decay time constant(msec): 0.9 | Decay time constant(msec): 2 | Decay time constant(msec): 10 |
| 0.00 | 1.00 | 1.00 | 1.00 | 1.00 | 1.00 |
| 0.05 | 0.78 | 0.88 | 0.95 | 0.98 | 1.00 |
| 0.10 | 0.61 | 0.78 | 0.89 | 0.95 | 0.99 |
| 0.15 | 0.47 | 0.69 | 0.85 | 0.93 | 0.99 |
| 0.20 | 0.37 | 0.61 | 0.80 | 0.90 | 0.98 |
| 0.25 | 0.29 | 0.54 | 0.76 | 0.88 | 0.98 |
| 0.30 | 0.22 | 0.47 | 0.72 | 0.86 | 0.97 |
| 0.35 | 0.17 | 0.42 | 0.68 | 0.84 | 0.97 |
| 0.40 | 0.14 | 0.37 | 0.64 | 0.82 | 0.96 |
| 0.45 | 0.11 | 0.32 | 0.61 | 0.80 | 0.96 |
| 0.50 | 0.08 | 0.29 | 0.57 | 0.78 | 0.95 |
| 0.55 | 0.06 | 0.25 | 0.54 | 0.76 | 0.95 |
| 0.60 | 0.05 | 0.22 | 0.51 | 0.74 | 0.94 |
| 0.65 | 0.04 | 0.20 | 0.49 | 0.72 | 0.94 |
| 0.70 | 0.03 | 0.17 | 0.46 | 0.70 | 0.93 |
| 0.75 | 0.02 | 0.15 | 0.43 | 0.69 | 0.93 |
| 0.80 | 0.02 | 0.14 | 0.41 | 0.67 | 0.92 |
| 0.85 | 0.01 | 0.12 | 0.39 | 0.65 | 0.92 |
| 0.90 | 0.01 | 0.11 | 0.37 | 0.64 | 0.91 |
| 0.95 | 0.01 | 0.09 | 0.35 | 0.62 | 0.91 |
| 1.00 | 0.01 | 0.08 | 0.33 | 0.61 | 0.90 |

As shown in Table 5, 0.45 msec after the first detection of a phosphorescence intensity, the phosphorescence intensity ratio with a decay time constant of 0.2 msec is 0.11, the phosphorescence intensity ratio with a decay time constant of 0.4 msec is 0.32, the phosphorescence intensity ratio with a decay time constant of 0.9 msec is 0.61, the phosphorescence intensity ratio with a decay time constant of 2 msec is 0.80, and the phosphorescence intensity ratio with a decay time constant of 10 msec is 0.96. Any difference between these intensity ratios is greater than 0.15. Therefore, when the subsequent detection of a phosphorescence intensity is performed 0.45 msec after the first detection of a phosphorescence intensity, whether the time constant of the detected phosphorescence is either 0.2 msec, 0.4 msec, 0.9 msec, 2 msec, or 10 msec can be recognized with reliability.

Moreover, as is clear from Table 5, there is no time at which any difference between the phosphorescence intensity ratios with decay time constants of 0.2 msec, 0.4 msec, 0.9 msec, 2 msec, and 10 msec, respectively becomes 0.2 or more. However, as shown in Table 5, when the subsequent detection is performed a certain time, which is in the range of 0.25 msec to 0.45 msec, after the first detection of the phosphorescence intensity, any difference between the phosphorescence intensity ratio with a decay time constant of 0.2 msec, the phosphorescence intensity ratio with a decay time constant of 0.4 msec, and the phosphorescence intensity ratio with a decay time constant of 0.9 msec becomes greater than 0.2. These intensity ratios become 0.1 or more. In other words, when the subsequent detection is performed a certain time, which is in the range of 0.25 msec to 0.45 msec, after the first detection of a phosphorescence intensity, whether the decay time constant of the detected phosphorescence is either 0.2 msec, 0.4 msec, or 0.9 msec can be recognized.

Further, as shown in Table 5, when additional detection of a phosphorescence intensity is performed a certain time, which is in the range of 0.60 msec to 0.90 msec, after the first detection of the phosphorescence intensity, any difference between the phosphorescence intensity ratio with a decay time constant of 0.4 msec, the phosphorescence intensity ratio with a decay time constant of 0.9 msec, the phosphorescence intensity ratio with a decay time constant of 2 msec, and the phosphorescence intensity ratio with a decay time constant of 10 msec becomes greater than 0.2. These intensity ratios become 0.1 or more. In other words, when additional detection is performed a certain time, which is in the range of 0.60 msec to 0.90 msec, after the first detection of a phosphorescence intensity, whether the decay time constant of the detected phosphorescence is either 0.9 msec, 2 msec, or 10 msec can be recognized.

Therefore, when the subsequent detection is performed a certain time, which is in the range of 0.25 msec to 0.45 msec, after the first detection of a phosphorescence intensity (at the second timing) and additional detection is performed a certain time, which is in the range of 0.60 msec to 0.90 msec, after the first detection of the phosphorescence intensity (at the third timing), whether the decay time constant of the detected phosphorescence is either 0.2 msec, 0.4 msec, 0.9 msec, 2 msec, or 10 msec can be recognized.

It should be noted that the additional detection of a phosphorescence intensity is performed not only when the subsequent detection is performed at the time when the difference between intensity ratios becomes 0.2 or more, or when there are five types of phosphorescent material to be recognized. For example, when there are four types of phosphorescent material to be recognized and the subsequent detection is performed at the time when the difference between the intensity ratios becomes 0.15 or more, additional detection of a phosphorescence intensity may be performed. The additional detection is not only performed after the subsequent detection. In other words, the additional detection may be performed after the first detection and before the subsequent detection. In other words, either the second timing or the third timing may be earlier.

(9) Method of Determining Authenticity of Detection Target 2

Upon determination of the detection timing in the aforementioned manner, the authenticity of the detection target T (security feature) attached to an object X to be conveyed may be determined, for example, in the following manner.

First, for each phosphorescence of the corresponding decay time constant, the range of the intensity ratio at the second timing (and, when necessary, the third timing) is determined in advance and stored in the storage unit 95. Next, the first detection of a phosphorescence intensity is performed for each photodetector 40, that is, for each phosphorescent color. Next, the subsequent detection of the phosphorescence intensity is performed at the second timing for each photodetector 40, that is, for each phosphorescent color, and the intensity ratio at the second timing is calculated for each phosphorescent color. Subsequently, whether or not the intensity ratio at the second timing is within a predetermined range is determined for each phosphorescent color. When all colors have values within the predetermined range, the detection target T is determined to be true. Otherwise, the detection target T is determined to be false. When the decay time constant of phosphorescence is different depending on each color, the second timing may be different depending on each photodetector 40. In addition, when additional detection is performed, the third timing may be different depending on each photodetector 40.

As described above, the authenticity of the detection target T (security feature) and consequently the authenticity of an object X to be conveyed, such as a sheet, can be determined using a feature that is the intensity ratio of phosphorescence at the second timing (and the third timing when necessary).

The phosphorescence detection apparatus and the phosphorescence detection method of the present invention, which detect a phosphorescent material attached as a security feature on the surface of a sheet, represented by value documents such as banknotes or securities, irradiate a phosphorescent material to be a detection target with excitation light to detect the phosphorescence emitted from the phosphorescent material. Since features, such as the spectrum and decay characteristics of phosphorescence, are determined by the composition of the phosphorescent material, the authenticity of the security feature can be determined by detecting phosphorescence and comparing their features.

The third embodiment is summarized as follows.

[1]

A phosphorescence detection apparatus including:

a light source that irradiates a detection target with excitation light, the detection target emitting at least one of multiple types of phosphorescence to be recognized;

a photodetector that detects the intensity of phosphorescence emitted from the detection target; and a control unit that controls the light source and the photodetector, in which the control unit performs the first detection of the intensity at a first timing after the stop of the irradiation with the excitation light, and performs the subsequent detection of the intensity at a second timing subsequent to the first detection, and the second timing is a timing at which the absolute value of a difference in the ratio of the intensity detected in the first detection to the intensity detected in the subsequent detection is greater than or equal to a predetermined value, between at least two of the multiple types of phosphorescence to be recognized.

[2]

The phosphorescence detection apparatus according to [1], in which the second timing comes a certain time after the first detection, the certain time being within a range of 0.05 msec to 1.00 msec.

[3]

The phosphorescence detection apparatus according to [2], in which the second timing comes a certain time after the first detection, the certain time being within a range of 0.10 msec to 1.00 msec.

[4]

The phosphorescence detection apparatus according to [3], in which the second timing comes a certain time after the first detection, the certain time being within a range of 0.20 msec to 0.45 msec.

[5]

The phosphorescence detection apparatus according to [4], in which the second timing comes a certain time after the first detection, the certain time being within a range of 0.25 msec to 0.45 msec.

[6]

The phosphorescence detection apparatus according to any one of [1] to [5], in which the second timing is, for all of the multiple types of phosphorescence to be recognized, the timing of when the absolute value of a difference in the ratio of the intensity detected in the first detection to the intensity detected in the subsequent detection becomes greater than or equal to a predetermined value.

[7]

The phosphorescence detection apparatus according to any one of [1] to [5], in which the control unit performs subsequent detection of the intensity at a third timing after performing subsequent detection of the intensity at the second timing, and the third timing is the timing of when the absolute value of a difference in the ratio of the intensity detected in the first detection to the intensity detected in the subsequent detection becomes greater than or equal to a predetermined value, between the phosphorescence for which the absolute value of a difference in the ratio to the intensity at the second timing did not become greater than or equal to a predetermined value among the multiple types of phosphorescence to be recognized.

[8]

The phosphorescence detection apparatus according to [7], in which the second timing comes a certain time after the first detection, the certain time being within a range of 0.25 msec to 0.45 msec, and the third timing comes a certain time after the first detection, the certain time being within a range of 0.60 msec to 0.90 msec.

[9]

The phosphorescence detection apparatus according to any one of [1] to [8], in which the first timing comes a certain time after the stop of irradiation with the excitation light, the certain time being in the range of 0.005 msec to 0.18 msec.

[10]

The phosphorescence detection apparatus according to any one of [1] to [9], in which the decay time constant of the phosphorescence is in the range of 0.2 msec to 10 msec.

[11]

The phosphorescence detection apparatus according to any one of [1] to [10], including a plurality of the photodetectors, in which the plurality of photodetectors detect the intensities of phosphorescence of different wavelengths.

[12]

The phosphorescence detection apparatus according to any one of Claims [1] to [11], in which the control unit performs recognition processing on a phosphorescent material contained in the detection target on the basis of the intensity.

[13]

A sheet processing apparatus including the phosphorescence detection apparatus according to any one of [1] to [12].

[14]

A phosphorescence detection method including:

irradiating a detection target with excitation light, the detection target emitting at least one of multiple types of phosphorescence to be recognized;

stopping the irradiation with the excitation light;

performing a first detection of the intensity of phosphorescence emitted from the phosphorescent material contained in the detection target at a first timing after stopping the irradiation with the excitation light; and performing subsequent detection of the intensity at a second timing subsequent to the first detection, in which the second timing is a timing at which the absolute value of a difference in the ratio of the intensity detected in the first detection to the intensity detected in the subsequent detection is greater than or equal to a predetermined value, between at least two of the multiple types of phosphorescence to be recognized.

Although the embodiments of the present invention have been described so far, the present invention is not limited to the aforementioned embodiments and various modifications can be made without departing from the scope of the present invention.

The disclosure of the specification, drawings, and abstract contained in each of Japanese application for Japanese Patent Application No. 2017-061065 filed on Mar. 27, 2017, Japanese application for Japanese Patent Application No. 2017-061074 filed on Mar. 27, 2017, and Japanese application for Japanese Patent Application No. 2017-061081 filed on Mar. 27, 2017, is hereby incorporated by reference.

INDUSTRIAL APPLICABILITY

The present invention is suitable for use in an optical sensor for detecting radiation light such as phosphorescence emitted from a detection target that emits radiation light when excited, a light detection apparatus, a sheet processing apparatus, or a light detection method.

REFERENCE SIGNS LIST

10 Optical sensor
20 Holder
21 Partition
30 Light source
40 Photodetector
50 Light guide
51 Excitation light incident surface 52 Radiation light emission surface
53 Light incident/emission surface
54 Standing surface
55 Side surface
56 Intermediate surface
60 Board
70 Optical filter
71 Visible light cut filter
72 Ultraviolet light cut filter
73 Color filter
80 Conveyor apparatus
90 Control apparatus
91 Conveyor apparatus control unit
92 Detection unit
93 Correction unit
94 Determination unit
95 Storage unit
100 Light detection apparatus (phosphorescence detection apparatus)
150 Cover

What is claimed is:

1. An optical sensor, comprising:
a light source that irradiates excitation light;
a photodetector that detects radiation light emitted from a detection target excited by the excitation light;
a single light guide that guides the excitation light passing through the single light guide to the detection target and guides the radiation light passing through the single light guide to the photodetector, the single light guide being formed in a block shape; and
a light-blocking region that prevents the excitation light from reaching the photodetector before reaching the detection target,
wherein:
the light source and the photodetector are disposed on one side of the single light guide,
the light-blocking region is a step, the step being present between a portion of the single light guide on a side of the light source and a portion of the single light guide on a side of the photodetector,
the step is formed by an excitation light incident surface being disposed so as to face the light source, a radiation light emission surface being disposed so as to face the photodetector and located closer to the other side of the single light guide or farther from the other side of the single light guide than the excitation light incident surface, and a standing surface located between the excitation light incident surface and the radiation light emission surface, and
the excitation light incident surface, radiation light emission surface and the standing surface are each formed in a planar shape.

2. The optical sensor according to claim 1, further comprising an optical filter between the light source and the single light guide and/or between the photodetector and the single light guide.

3. The optical sensor according to claim 1, wherein the light source and the photodetector are disposed on a same board.

4. A light detection apparatus, comprising:
the optical sensor according to claim 1; and
an intensity corrector that corrects an intensity of the radiation light detected by the photodetector based on a relative position of the detection target with respect to the photodetector when the radiation light is detected.

5. The light detection apparatus according to claim 4, wherein the light source irradiates the excitation light while the detection target moves, and the light source is disposed upstream from the photodetector in a moving direction of the detection target.

6. A sheet processing apparatus, comprising the light detection apparatus according to claim 5.

7. A sheet processing apparatus, comprising the light detection apparatus according to claim 4.

8. A light detection method conducted by using the optical sensor according to claim 1, comprising:
irradiating excitation light from the light source;
guiding the excitation light to the detection target by the single light guide;
preventing, through the step, the excitation light from reaching the photodetector before reaching the detection target; and
detecting, through the photodetector, radiation light that has been emitted from the detection target excited by the excitation light passing through the single light guide and being guided to the detection target by the single light guide, and that has passed through the single light guide and has been guided to the photodetector by the single light guide.

9. A phosphorescence detection apparatus, comprising the optical sensor according to claim 1, wherein:
the light source is a light source that irradiates a detection target with the excitation light, the detection target containing a phosphorescent material,
the photodetector is a photodetector that detects an intensity of phosphorescence emitted from the detection target, and
the phosphorescence detection apparatus further comprises:
an intensity detector that controls the light source and the photodetector, and detects the intensity at least three times after stop of the irradiation with the excitation light while changing a detection time; and
a phosphorescence determiner that determines whether or not the phosphorescence results from multiple types of phosphorescence having different decay time constants, based on the at least three intensities detected by the intensity detector and their detection times.

10. A phosphorescence detection apparatus, comprising the optical sensor according to claim 1, wherein:
the light source is a light source that irradiates a detection target with excitation light, the detection target emitting at least one of multiple types of phosphorescence to be recognized,
the photodetector is a photodetector that detects an intensity of phosphorescence emitted from the detection target,
the phosphorescence detection apparatus further comprises a controller that controls the light source and the photodetector,
the controller performs a first detection of the intensity at a first timing after stop of the irradiation with the excitation light, and performs subsequent detection of the intensity at a second timing subsequent to the first detection, and
the second timing is a timing at which an absolute value of a difference in a ratio of the intensity detected in the first detection to the intensity detected in the subsequent detection is greater than or equal to a predetermined value, between at least two of the multiple types of phosphorescence to be recognized.

* * * * *